: US010381366B1

United States Patent
Takahashi et al.

(10) Patent No.: US 10,381,366 B1
(45) Date of Patent: Aug. 13, 2019

(54) AIR GAP THREE-DIMENSIONAL CROSS RAIL MEMORY DEVICE AND METHOD OF MAKING THEREOF

(71) Applicant: SANDISK TECHNOLOGIES LLC, Plano, TX (US)

(72) Inventors: Yuji Takahashi, Yokkaichi (JP); Satoru Mayuzumi, Yokkaichi (JP); Vincent Shih, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 6 days.

(21) Appl. No.: 15/898,571

(22) Filed: Feb. 17, 2018

(51) Int. Cl.
| | |
|---|---|
| *H01L 27/11556* | (2017.01) |
| *H01L 27/102* | (2006.01) |
| *H01L 27/06* | (2006.01) |
| *H01L 45/00* | (2006.01) |
| *G11C 16/04* | (2006.01) |
| *H01L 21/822* | (2006.01) |

(52) U.S. Cl.
CPC .... *H01L 27/11556* (2013.01); *G11C 16/0441* (2013.01); *H01L 21/8221* (2013.01); *H01L 27/0688* (2013.01); *H01L 27/1021* (2013.01); *H01L 45/143* (2013.01); *H01L 45/144* (2013.01)

(58) Field of Classification Search
CPC ........... H01L 27/11556; H01L 21/8221; H01L 45/143; H01L 27/0688; H01L 27/1021; H01L 45/144; G11C 16/0441
See application file for complete search history.

(56) References Cited

U.S. PATENT DOCUMENTS

| | | | |
|---|---|---|---|
| 6,753,571 B2 | 6/2004 | Kim et al. | |
| 6,867,082 B2 | 3/2005 | Kim et al. | |
| 7,180,124 B2 | 2/2007 | Kim et al. | |
| 7,183,154 B2 | 2/2007 | Kim et al. | |
| 7,262,502 B2 | 8/2007 | Chang | |
| 7,427,531 B2 | 9/2008 | Cho et al. | |
| 7,682,904 B2 | 3/2010 | Kim et al. | |
| 7,994,493 B2 | 8/2011 | Cho et al. | |
| 8,097,498 B2 | 1/2012 | Purayath et al. | |

(Continued)

FOREIGN PATENT DOCUMENTS

WO    WO 2009/091786 A1    7/2009

OTHER PUBLICATIONS

U.S. Appl. No. 15/478,637, filed Apr. 4, 2017, Sandisk Technologies LLC.

(Continued)

*Primary Examiner* — David Vu
(74) *Attorney, Agent, or Firm* — The Marbury Law Group PLLC

(57) ABSTRACT

A memory device includes first conductive rails laterally extending along a first horizontal direction over a substrate, a rectangular array of first memory pillar structures, each containing a memory element, overlying top surfaces of the first conductive rails, second conductive rails laterally extending along a second horizontal direction and overlying top surfaces of the rectangular array of first memory pillar structures, and a one-dimensional array of first cavities free of solid material portions therein, laterally extending along the second horizontal direction and located between neighboring pairs of the second conductive rails.

14 Claims, 27 Drawing Sheets

(56) References Cited

U.S. PATENT DOCUMENTS

| | | |
|---|---|---|
| 8,559,232 B2 | 11/2013 | Lee et al. |
| 9,029,828 B2 | 11/2015 | Oh |
| 2003/0185073 A1 | 10/2003 | Kim et al. |
| 2004/0207005 A1 | 10/2004 | Kim et al. |
| 2005/0056880 A1 | 3/2005 | Kim et al. |
| 2005/0064655 A1 | 3/2005 | Kim et al. |
| 2005/0073010 A1 | 4/2005 | Lai et al. |
| 2006/0001164 A1 | 1/2006 | Chang |
| 2006/0186483 A1 | 8/2006 | Cho et al. |
| 2006/0246606 A1 | 11/2006 | Hsu et al. |
| 2008/0254576 A1 | 10/2008 | Hsia et al. |
| 2008/0303016 A1 | 12/2008 | Cho et al. |
| 2009/0023279 A1 | 1/2009 | Kim et al. |
| 2011/0267883 A1 | 11/2011 | Lee et al. |
| 2014/0124726 A1 | 5/2014 | Oh |
| 2017/0170237 A1* | 6/2017 | Jung .................. H01L 45/1233 |

OTHER PUBLICATIONS

U.S. Appl. No. 15/637,357, filed Jun. 29, 2017, Sandisk Technologies LLC.
U.S. Appl. No. 15/843,777, filed Dec. 15, 2017, Sandisk Technologies LLC.
U.S. Appl. No. 15/844,005, filed Dec. 15, 2017, Sandisk Tehcnologies LLC.
U.S. Appl. No. 15/888,645, filed Feb. 5, 2018, Sandisk Tehcnologies LLC.

* cited by examiner

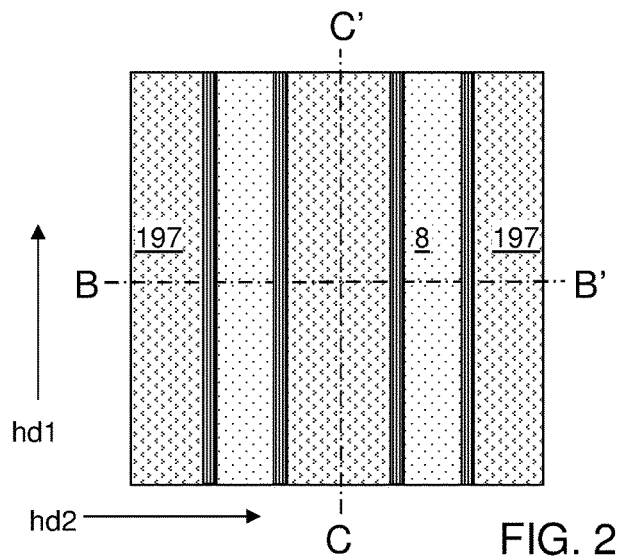
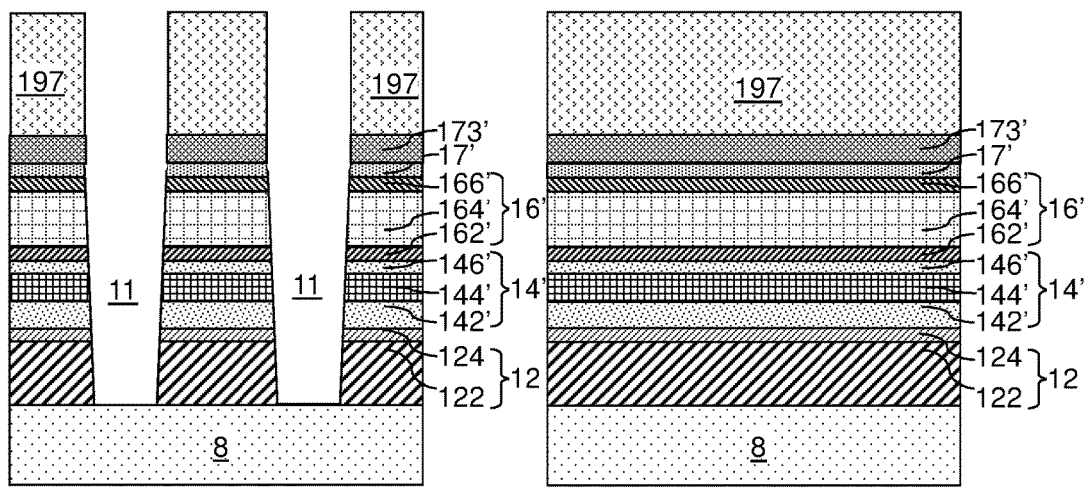
FIG. 2A
FIG. 2B
FIG. 2C

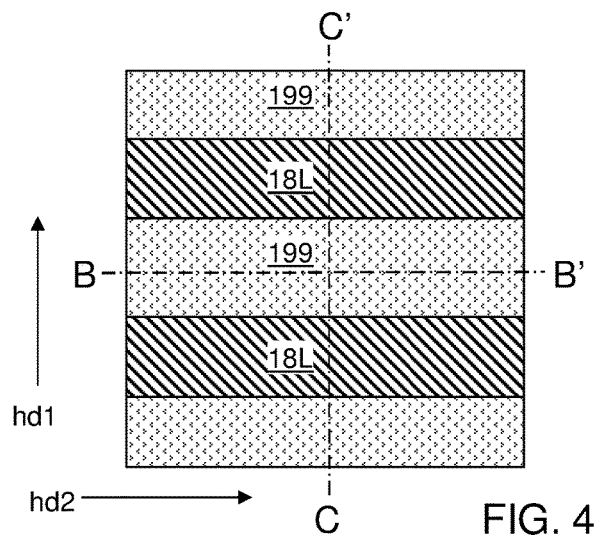
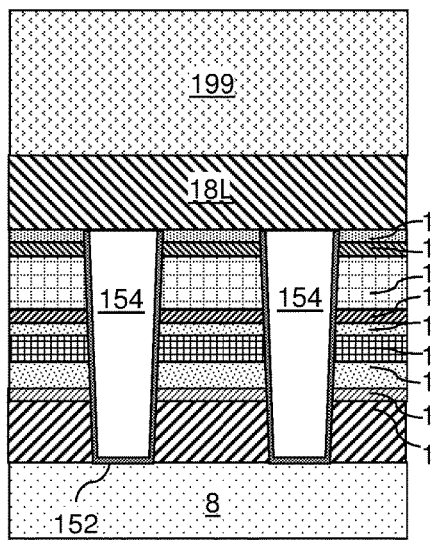 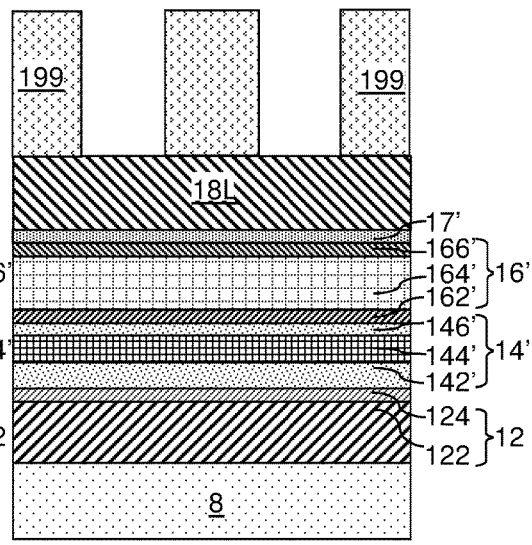
FIG. 4A
FIG. 4B
FIG. 4C

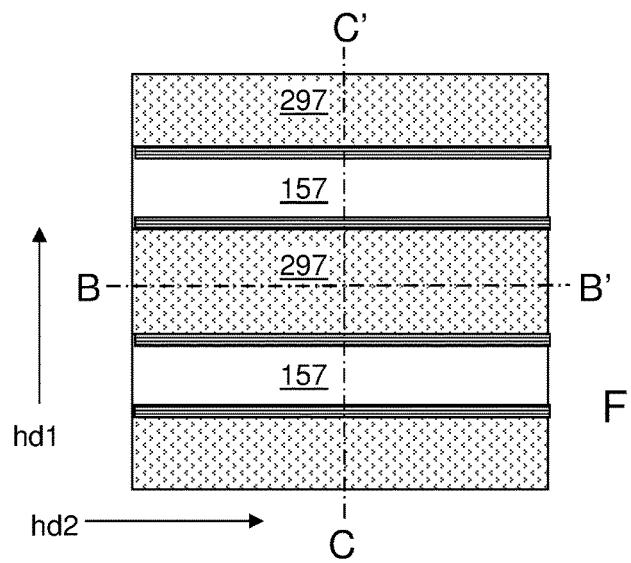
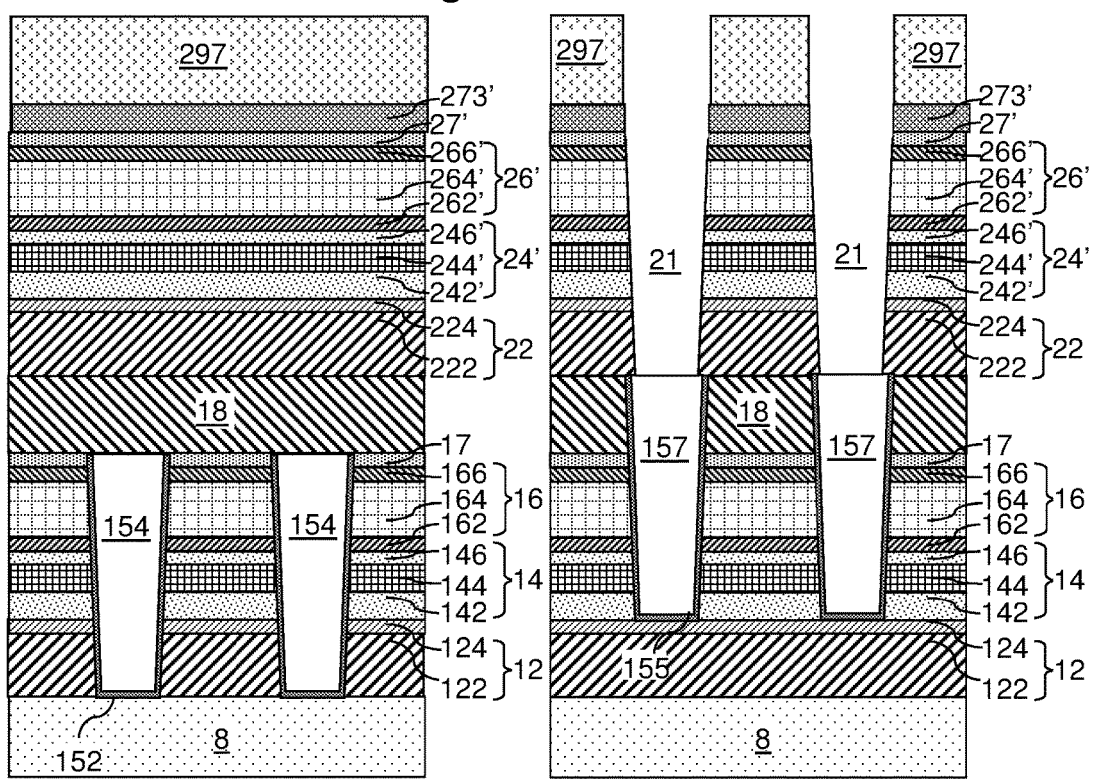
FIG. 8A
FIG. 8B    FIG. 8C

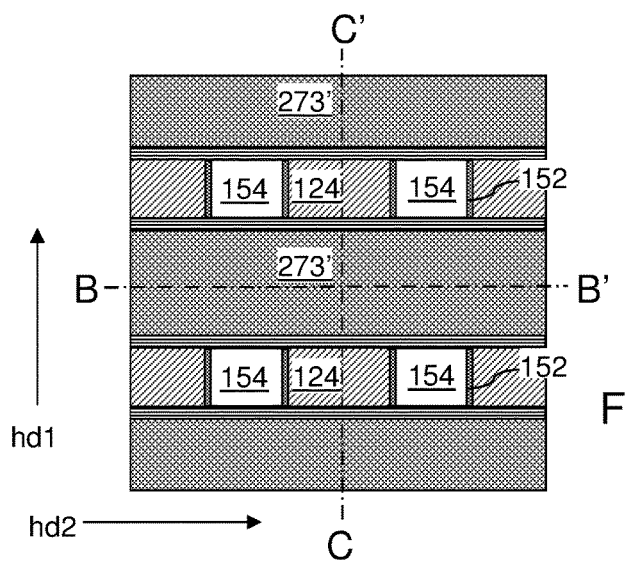
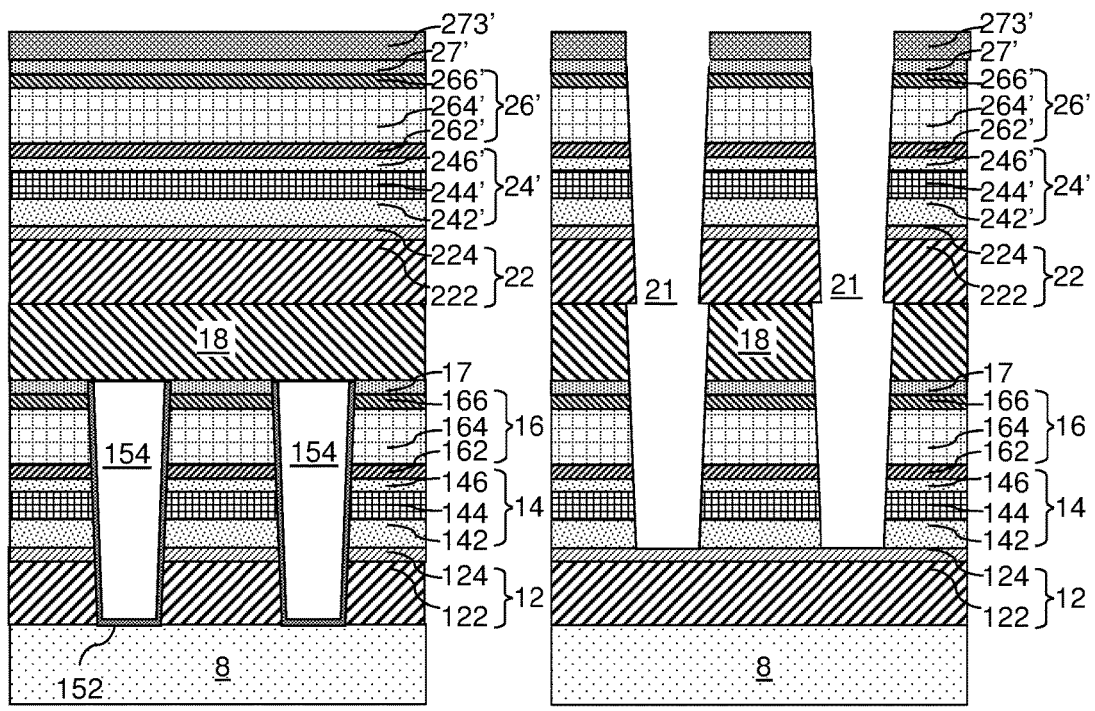
FIG. 9A
FIG. 9B
FIG. 9C

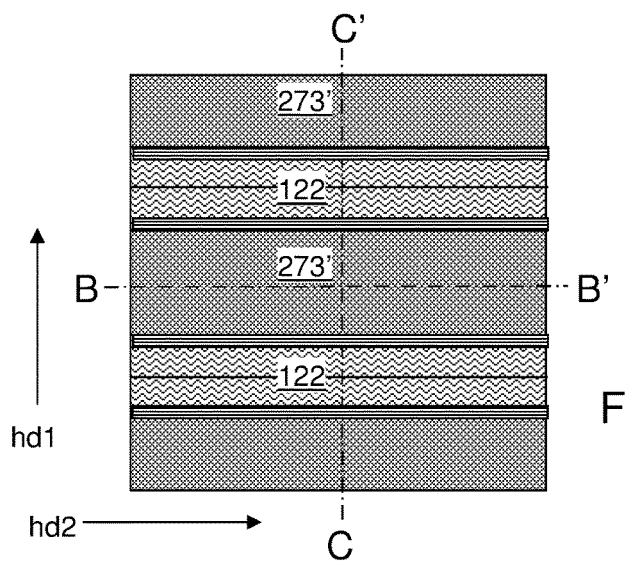
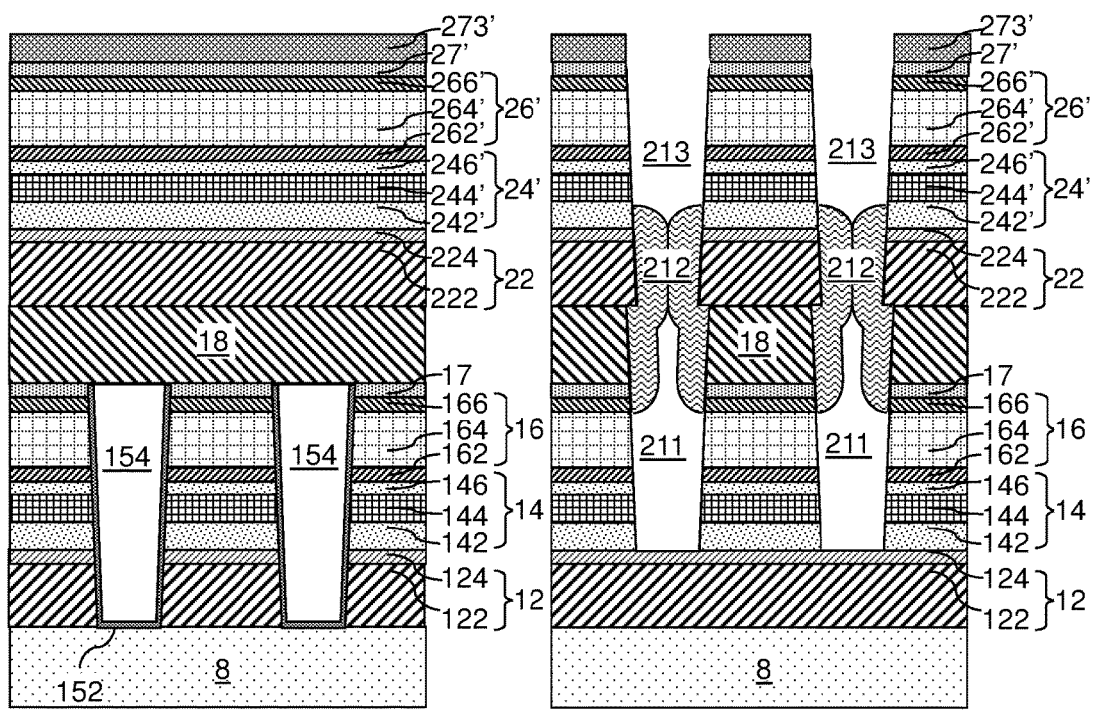
FIG. 10A
FIG. 10B
FIG. 10C

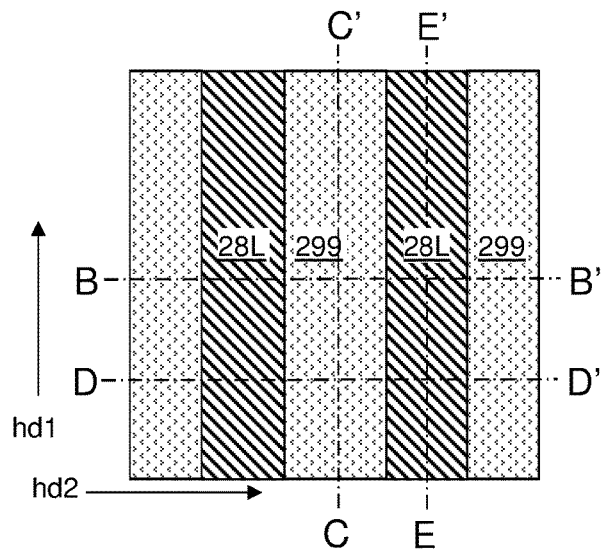
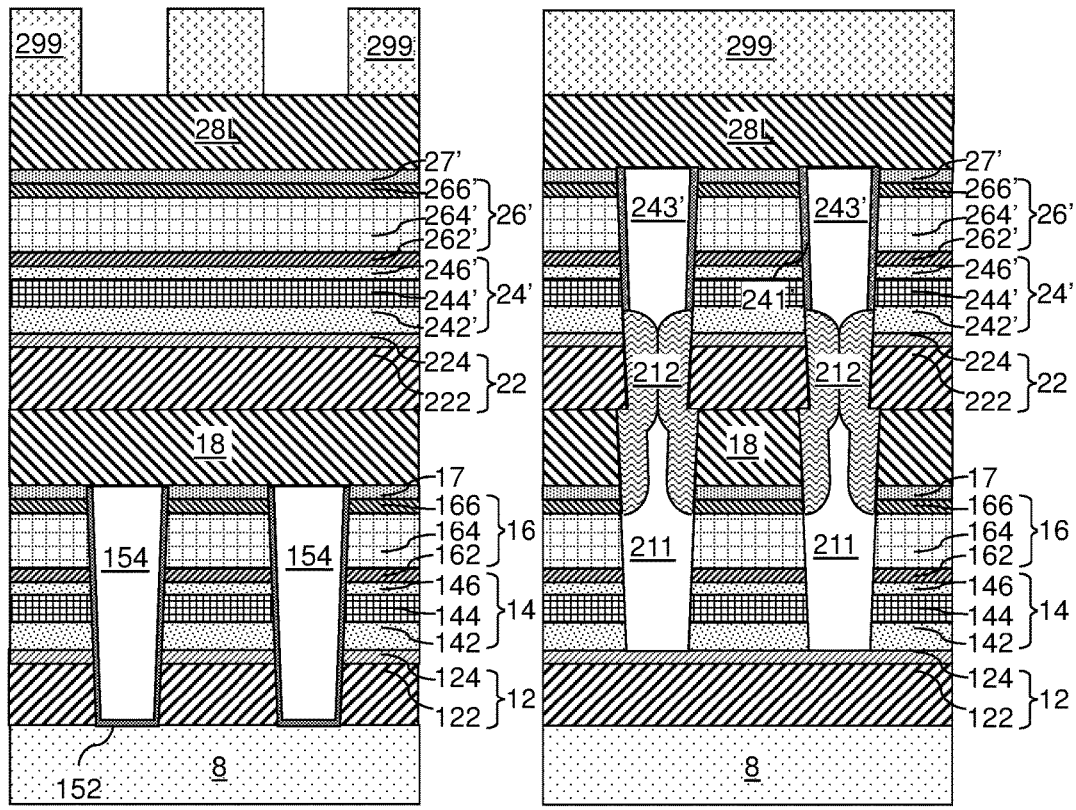
FIG. 13A
FIG. 13B
FIG. 13C

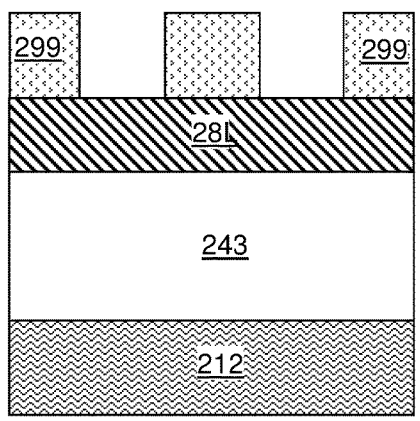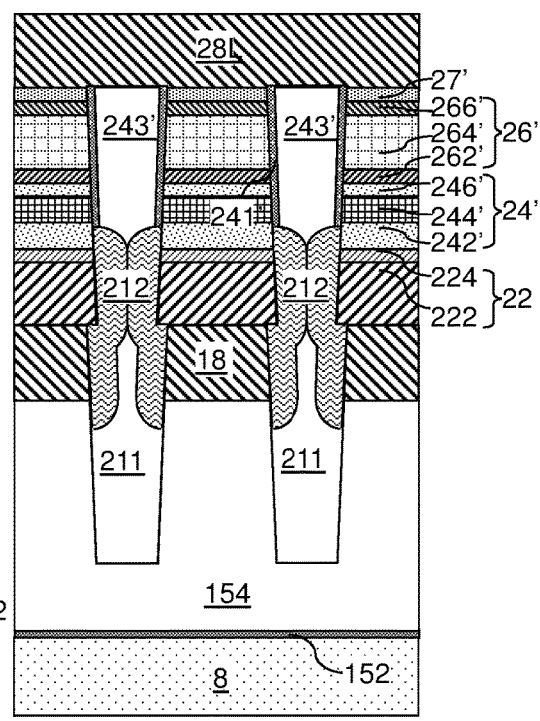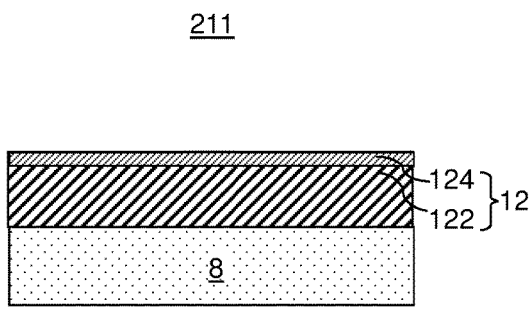
FIG. 13D   FIG. 13E

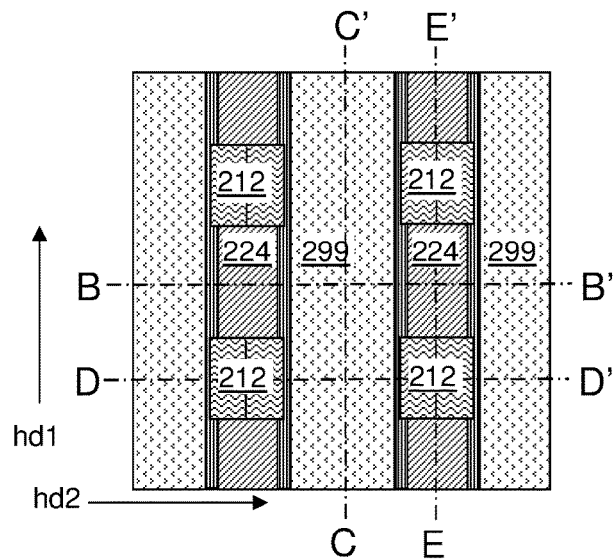
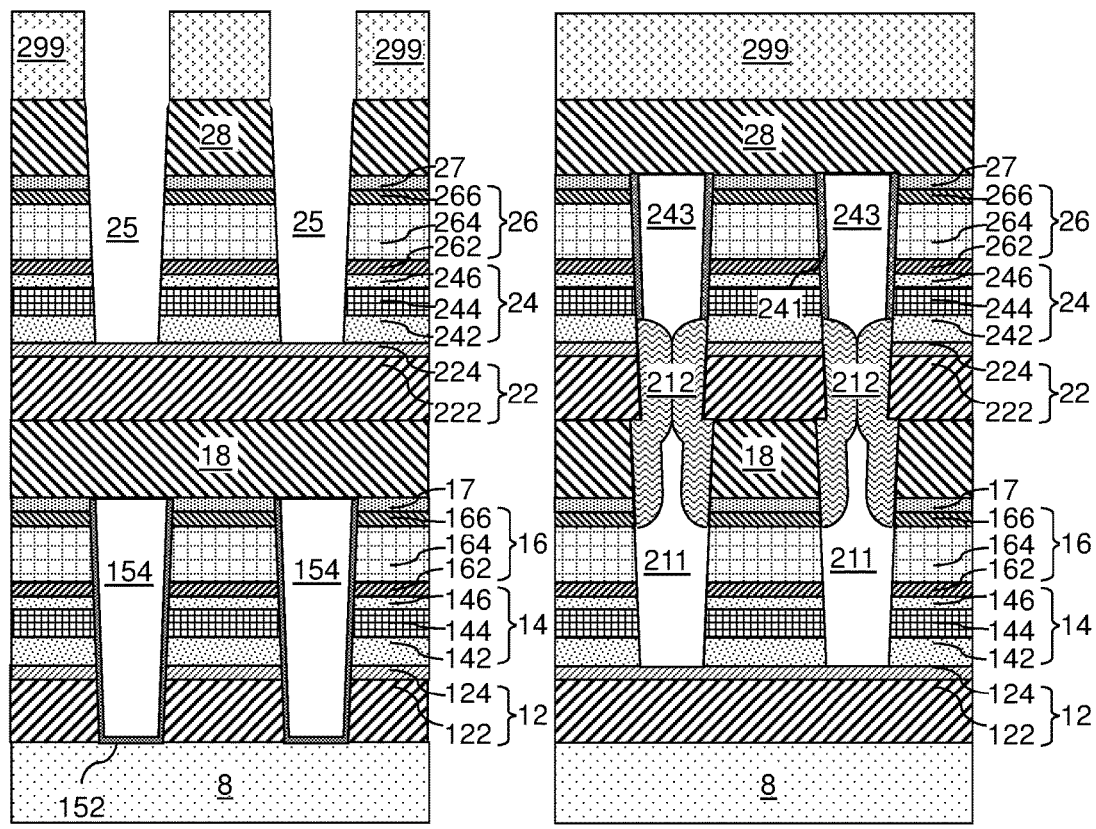
FIG. 14A
FIG. 14B  FIG. 14C

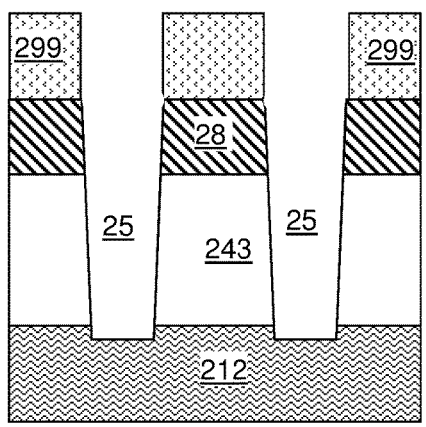
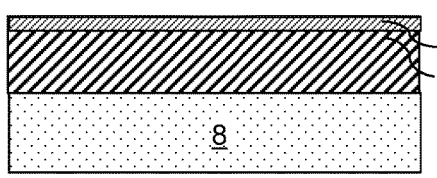
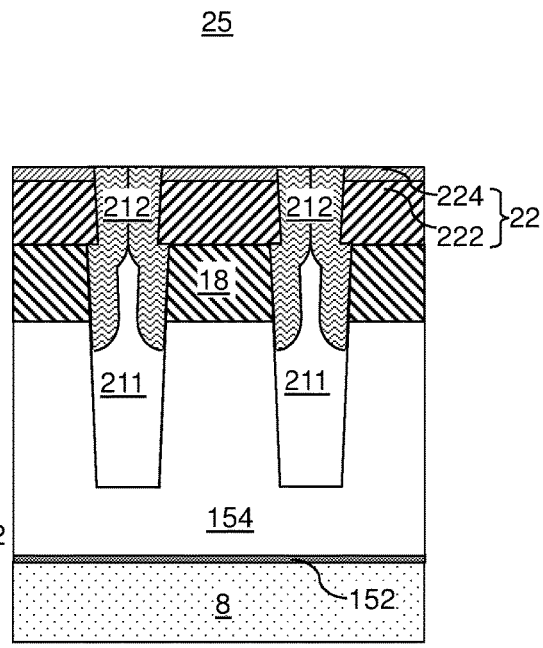
FIG. 14D
FIG. 14E

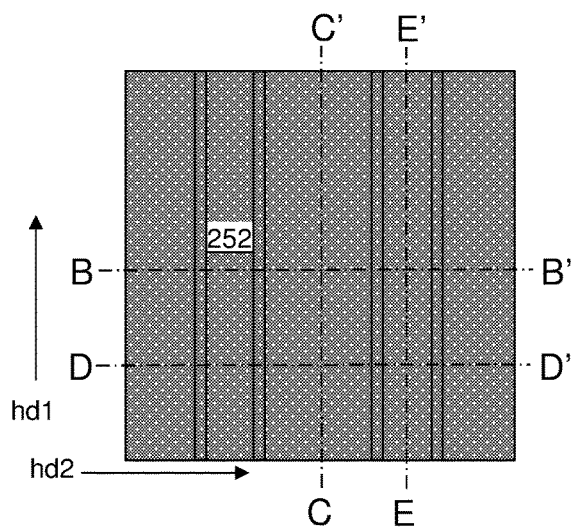
FIG. 16A
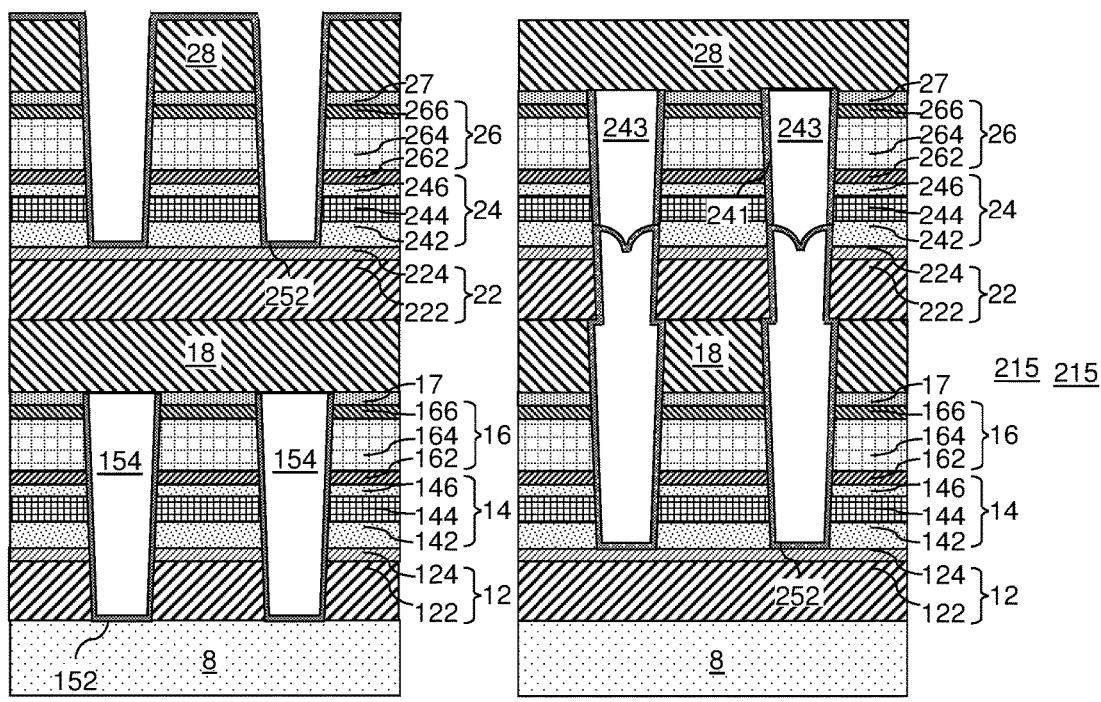
FIG. 16B
FIG. 16C

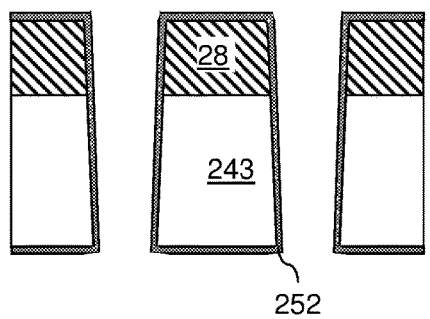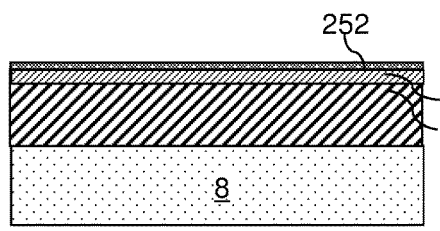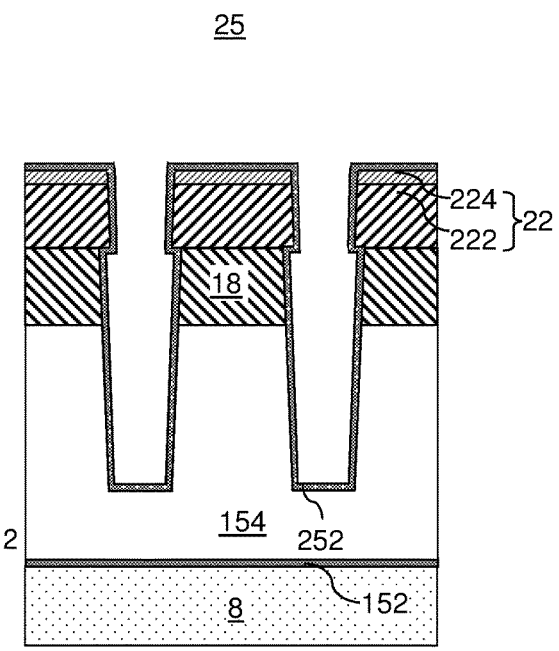
FIG. 16D    FIG. 16E

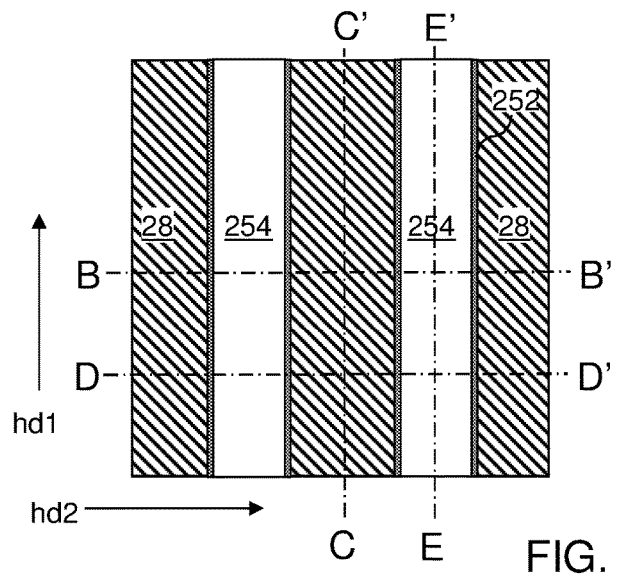
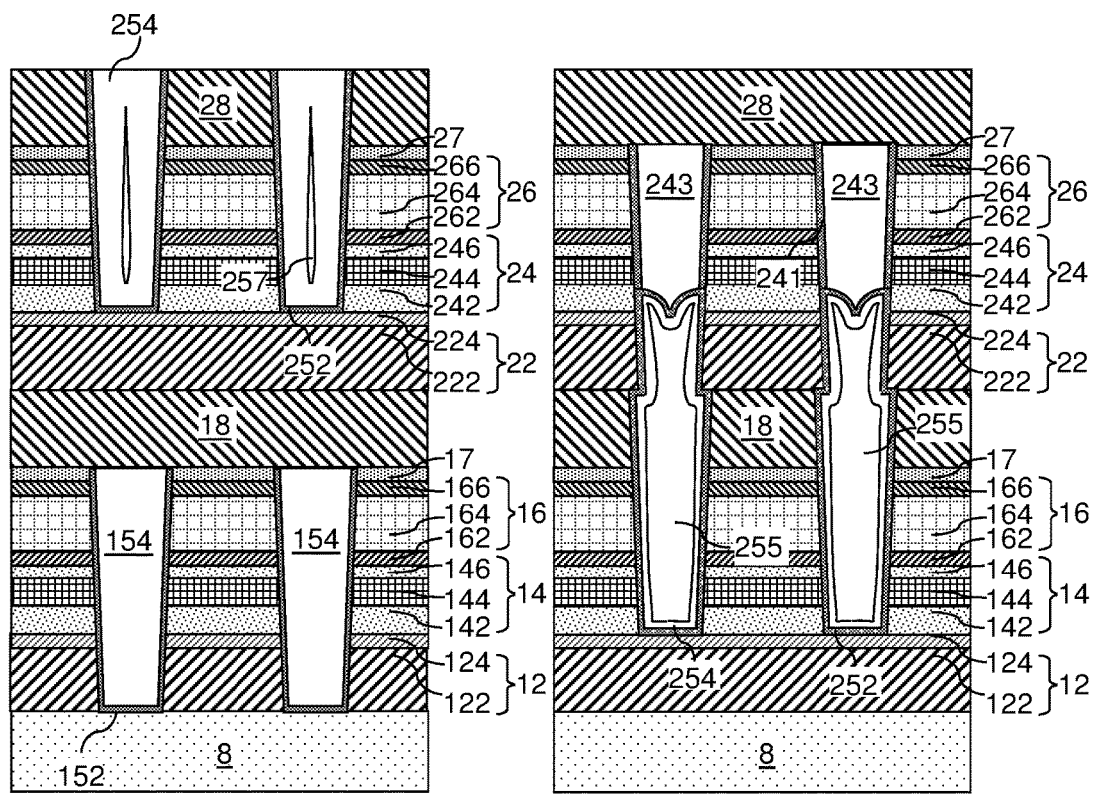
FIG. 18A
FIG. 18B
FIG. 18C

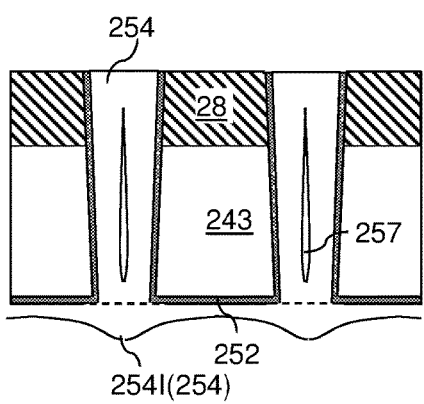
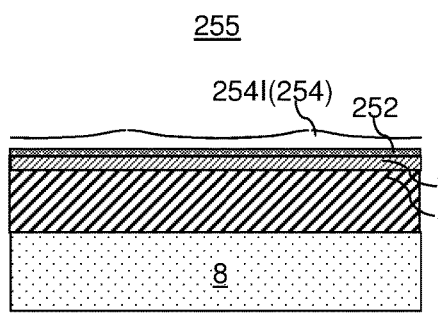
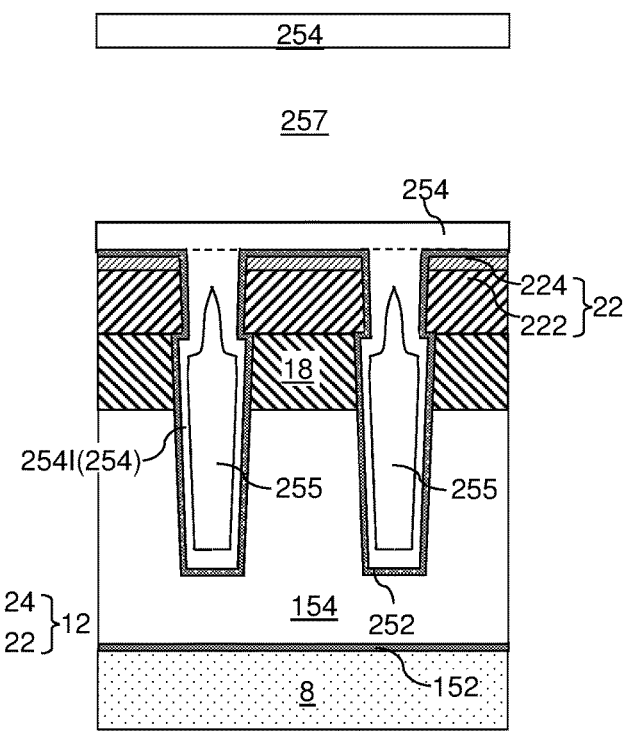
FIG. 18D
FIG. 18E

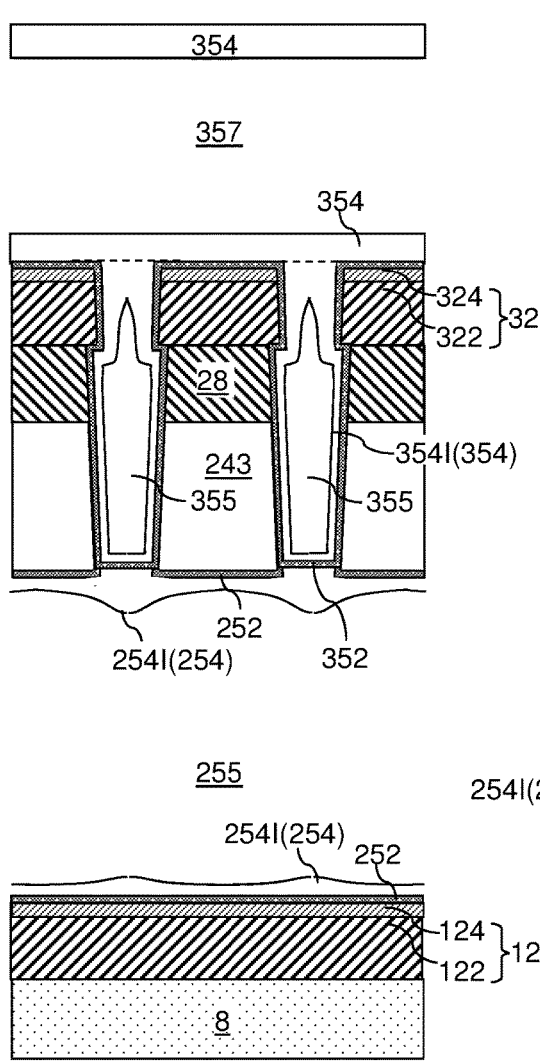
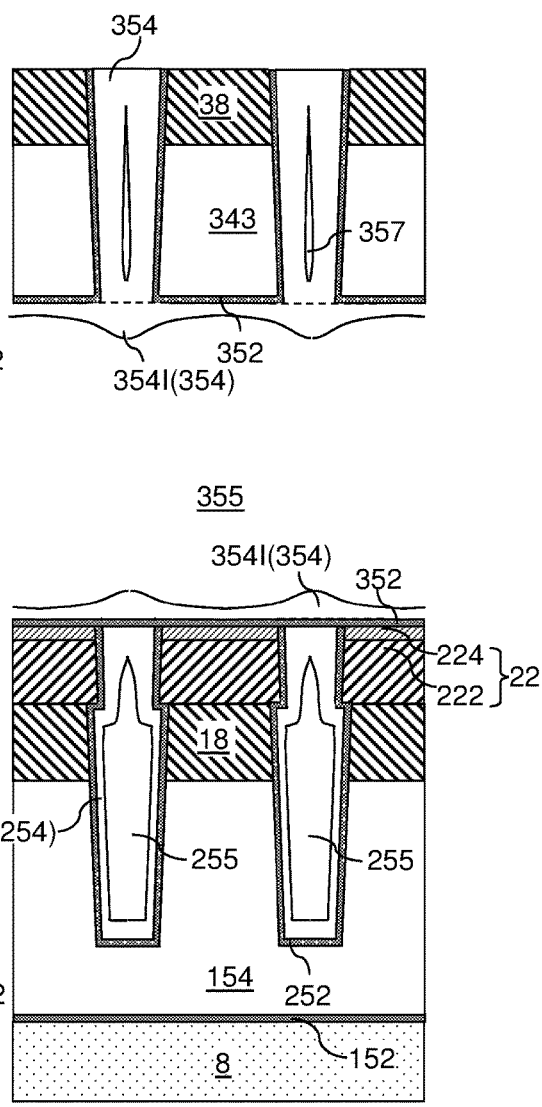
FIG. 19D
FIG. 19E

AIR GAP THREE-DIMENSIONAL CROSS RAIL MEMORY DEVICE AND METHOD OF MAKING THEREOF

FIELD

The present disclosure relates generally to the field of semiconductor devices and specifically to three-dimensional cross rail memory structures including air gaps and methods of forming the same.

BACKGROUND

A phase change material (PCM) memory device is a type of non-volatile memory device that stores information as a resistive state of a material that can be in different resistive states corresponding to different phases of the material. The different phases can include an amorphous state having high resistivity and a crystalline state having low resistivity (i.e., a lower resistivity than in the amorphous state). The transition between the amorphous state and the crystalline state can be induced by controlling the rate of cooling after application of an electrical pulse that renders the phase change memory material in a first part of a programming process. The second part of the programming process includes control of the cooling rate of the phase change memory material. If rapid quenching occurs, the phase change memory material can cool into an amorphous high resistivity state. If slow cooling occurs, the phase change memory material can cool into a crystalline low resistivity state.

SUMMARY

According to an aspect of the present disclosure, a memory device is provided, which comprises: first conductive rails laterally extending along a first horizontal direction over a substrate; a rectangular array of first memory pillar structures overlying top surfaces of the first conductive rails, wherein each first memory pillar structure comprises a respective memory element; second conductive rails laterally extending along a second horizontal direction and overlying top surfaces of the rectangular array of first memory pillar structures; and a one-dimensional array of first cavities free of solid material portions therein laterally extending along the second horizontal direction and located between neighboring pairs of the second conductive rails.

According to another aspect of the present disclosure, a method of forming a memory device is provided, which comprises the steps of: forming first conductive rails laterally extending along a first horizontal direction, a rectangular array of first memory pillar structures, and second conductive rails laterally extending along a second horizontal direction over a substrate, wherein the first conductive rails and rows of the first memory pillar structures are laterally spaced by first trenches, and lower portions of the second conductive rails and columns of the first memory pillar structures are laterally spaced by second trenches, and upper portions of the second conductive rails are laterally spaced by third trenches; forming sacrificial semiconductor structures by selectively growing a semiconductor material from sidewalls of the second conductive rails; forming dielectric isolation structures in upper portions of the third trenches by depositing at least one dielectric material therein; forming fourth trenches laterally extending along the first horizontal direction through the vertical stacks and the dielectric isolation structures, wherein a rectangular array of second memory pillar structures are formed by remaining portions of the vertical stacks; and removing the sacrificial semiconductor structures from underneath the fourth trenches to form a one-dimensional array of first cavities free of solid material portions therein, laterally extending along the second horizontal direction, wherein the second conductive rails are laterally spaced among one another by the one-dimensional array of first cavities.

BRIEF DESCRIPTION OF THE DRAWINGS

FIG. 2A is a top-down view of the exemplary structure after formation of first stacked rail structures laterally spaced by first trenches through the first layer stack according to an embodiment of the present disclosure.

FIG. 2B is a vertical cross-sectional view of the exemplary structure along the vertical plane B-B' of FIG. 2A.

FIG. 2C is a vertical cross-sectional view of the exemplary structure along the vertical plane C-C' of FIG. 2A.

FIG. 3A is a top-down view of the exemplary structure after formation of first dielectric isolation structures according to an embodiment of the present disclosure.

FIG. 4A is a top-down view of the exemplary structure after formation of a first top conductive layer and a patterned second photoresist layer over the first stacked rail structures and the first dielectric isolation structures according to an embodiment of the present disclosure.

FIG. 4B is a vertical cross-sectional view of the exemplary structure along the vertical plane B-B' of FIG. 4A.

FIG. 4C is a vertical cross-sectional view of the exemplary structure along the vertical plane C-C' of FIG. 4A.

FIG. 6A is a top-down view of the exemplary structure after formation of first sacrificial trench fill structures according to an embodiment of the present disclosure.

FIG. 7A is a top-down view of the exemplary structure after formation of a second layer stack including a second bottom conductive layer, a second selector layer, a second phase change memory layer stack, and an optional second barrier layer according to an embodiment of the present disclosure.

FIG. 8A is a top-down view of the exemplary structure after formation of second upper conductive rails and second stacked rail structures laterally spaced by third trenches through the second layer stack according to an embodiment of the present disclosure.

FIG. 8B is a vertical cross-sectional view of the exemplary structure along the vertical plane B-B' of FIG. 8A.

FIG. 8C is a vertical cross-sectional view of the exemplary structure along the vertical plane C-C' of FIG. 8A.

FIG. 9A is a top-down view of the exemplary structure after removal of first sacrificial trench fill structures and extension of the third trenches according to an embodiment of the present disclosure.

FIG. 9B is a vertical cross-sectional view of the exemplary structure along the vertical plane B-B' of FIG. 9A.

FIG. 9C is a vertical cross-sectional view of the exemplary structure along the vertical plane C-C' of FIG. 9A.

FIG. 10A is a top-down view of the exemplary structure after formation of sacrificial semiconductor structures by a selective deposition process according to an embodiment of the present disclosure.

FIG. 10B is a vertical cross-sectional view of the exemplary structure along the vertical plane B-B' of FIG. 10A.

FIG. 10C is a vertical cross-sectional view of the exemplary structure along the vertical plane C-C' of FIG. 10A.

FIG. 13A is a top-down view of the exemplary structure after formation of a second top conductive layer and a patterned fourth photoresist layer over the second stacked rail structures and the second dielectric isolation structures according to an embodiment of the present disclosure.

FIG. 13B is a vertical cross-sectional view of the exemplary structure along the vertical plane B-B' of FIG. 13A.

FIG. 13C is a vertical cross-sectional view of the exemplary structure along the vertical plane C-C' of FIG. 13A.

FIG. 13D is a vertical cross-sectional view of the exemplary structure along the vertical plane D-D' of FIG. 13A.

FIG. 13E is a vertical cross-sectional view of the exemplary structure along the vertical plane E-E' of FIG. 13A.

FIG. 14A is a vertical cross-sectional view of the exemplary structure after formation of fourth trenches through the second top conductive layer, the second stacked rail structures, and the second dielectric isolation structures and formation of third lower conductive rails according to an embodiment of the present disclosure.

FIG. 14B is a vertical cross-sectional view of the exemplary structure along the vertical plane B-B' of FIG. 14A.

FIG. 14C is a vertical cross-sectional view of the exemplary structure along the vertical plane C-C' of FIG. 14A.

FIG. 14D is a vertical cross-sectional view of the exemplary structure along the vertical plane D-D' of FIG. 14A.

FIG. 14E is a vertical cross-sectional view of the exemplary structure along the vertical plane E-E' of FIG. 14A.

FIG. 16A is a vertical cross-sectional view of the exemplary structure after conformal deposition of an outer dielectric liner according to an embodiment of the present disclosure.

FIG. 16B is a vertical cross-sectional view of the exemplary structure along the vertical plane B-B' of FIG. 16A.

FIG. 16C is a vertical cross-sectional view of the exemplary structure along the vertical plane C-C' of FIG. 16A.

FIG. 16D is a vertical cross-sectional view of the exemplary structure along the vertical plane D-D' of FIG. 16A.

FIG. 16E is a vertical cross-sectional view of the exemplary structure along the vertical plane E-E' of FIG. 16A.

FIG. 18A is a vertical cross-sectional view of the exemplary structure after formation of dielectric fill material portions by a planarization process according to an embodiment of the present disclosure.

FIG. 18B is a vertical cross-sectional view of the exemplary structure along the vertical plane B-B' of FIG. 18A.

FIG. 18C is a vertical cross-sectional view of the exemplary structure along the vertical plane C-C' of FIG. 18A.

FIG. 18D is a vertical cross-sectional view of the exemplary structure along the vertical plane D-D' of FIG. 18A.

FIG. 18E is a vertical cross-sectional view of the exemplary structure along the vertical plane E-E' of FIG. 18A.

FIG. 19D is a vertical cross-sectional view of the exemplary structure along the vertical plane D-D' of FIG. 19A.

FIG. 19E is a vertical cross-sectional view of the exemplary structure along the vertical plane E-E' of FIG. 19A.

DETAILED DESCRIPTION

Figure 1A:
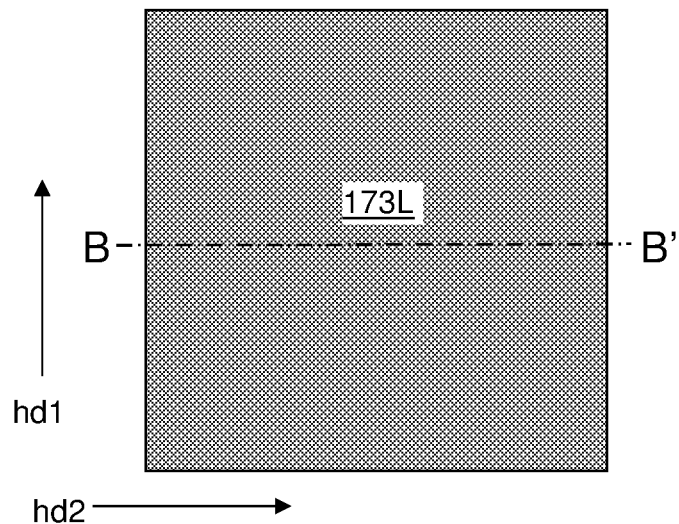
FIG. 1A is a top-down view of an exemplary structure for forming a three-dimensional phase change memory device after formation of a first layer stack including a first bottom conductive layer, a first selector layer, a first phase change memory layer, and an optional first barrier layer according to an embodiment of the present disclosure.

As discussed above, the present disclosure is directed to three-dimensional cross rail phase change memory structures including air gaps and methods of forming the same, the various aspects of which are described below. The air gaps reduce capacitive coupling of conductive lines in a three-dimensional phase change memory device, which improves the device performance by reducing the RC delay. The drawings are not drawn to scale. Multiple instances of an element may be duplicated where a single instance of the element is illustrated, unless absence of duplication of elements is expressly described or clearly indicated otherwise. Unless otherwise indicated, a "contact" between elements refers to a direct contact between elements that provides an edge or a surface shared by the elements. Ordinals such as "first," "second," and "third" are employed merely to identify similar elements, and different ordinals may be employed across the specification and the claims of the instant disclosure. A same reference numeral refers to a same element or a similar element. Unless otherwise noted, elements with a same reference numeral are presumed to have a same material composition.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Figure 1B:
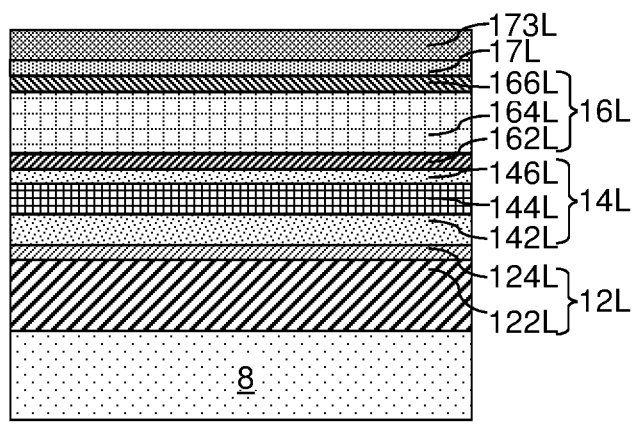
FIG. 1B is a vertical cross-sectional view of the exemplary structure along the vertical plane B-B' of FIG. 1A.

Referring to FIGS. 1A and 1B, an exemplary structure for forming a three-dimensional phase change memory device is illustrated, which includes a substrate 8. The substrate 8 includes an insulating material layer in an upper portion, and may optionally include additional layers (not illustrated) underneath, which can include, for example, a semiconductor material layer and interconnect level dielectric layers embedding metal interconnect structures therein. In one embodiment, semiconductor devices such as field effect transistors may be provided on the semiconductor material layer, and the metal interconnect structures can provide electrically conductive paths among the semiconductor devices. The exemplary structure includes a memory array region, which is illustrated herein, and a peripheral region (not illustrated) including interconnect structures and/or peripheral devices. Memory cells are subsequently formed in the memory array region.

A first vertical stack (12L, 14L, 16L, 17L, 173L), which is also referred to as a first layer stack, is formed over the substrate 8. The first vertical stack (12L, 14L, 16L, 17L, 173L) can include a first bottom conductive layer 12L, a first selector layer 14L, a first phase change memory layer 16L, an optional first barrier layer 17L, and an optional first hard mask layer 173L. Each layer in the first vertical stack (12L, 14L, 16L, 17L, 173L) can be formed as a blanket material layer, i.e., an unpatterned material layer that laterally extend along a first horizontal direction hd1 and a second horizontal direction hd2 that is perpendicular to the first horizontal direction hd1.

The first bottom conductive layer 12L includes at least one conductive material layer, which can be at least one metallic material layer. For example, the first bottom conductive layer 12L can include a layer stack, from bottom to top, of a first metal layer 122L (such as a tungsten layer) and a first metal nitride layer 124L (such as a tungsten nitride layer or a titanium nitride layer). The thickness of the first metal layer 122L can be in a range from 20 nm to 100 nm, such as from 30 nm to 70 nm, although lesser and greater thicknesses can also be employed. The thickness of the first metal nitride layer 124L can be in a range from 1 nm to 10 nm, such as from 1.5 nm to 5 nm, although lesser and greater thicknesses can also be employed.

The first selector layer 14L includes a non-Ohmic material that provides electrical connection of electrical isolation depending on the magnitude and/or the polarity of an externally applied voltage bias thereacross. In one embodiment, the first selector layer 14L includes at least one threshold switch material layer. The at least one threshold switch material layer includes any suitable threshold switch material which exhibits non-linear electrical behavior, such as an ovonic threshold switch material or a diode threshold switch material (e.g., materials for p-n semiconductor diode, p-i-n semiconductor diode, Schottky diode or metal-insulator-metal diode). As used herein, an ovonic threshold switch (OTS) is a device that does not crystallize in a low resistance state under a voltage above the threshold voltage, and reverts back to a high resistance state when not subjected to a voltage above the threshold voltage across the OTS material layer. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage.

An ovonic threshold switch material (OTS material) can be non-crystalline (for example, amorphous) in a high resistance state, and can remain non-crystalline (for example, remain amorphous) in a low resistance state during application of a voltage above its threshold voltage across the OTS material. The OTS material can revert back to the high resistance state when the high voltage above its threshold voltage is removed. Throughout the resistive state changes, the ovonic threshold switch material can remain non-crystalline (e.g., amorphous). In one embodiment, the ovonic threshold switch material can comprise layer a chalcogenide material which exhibits hysteresis in both the write and read states. The chalcogenide material may be a GeTe compound or a Ge—Se compound doped with a dopant selected from As, N, and C, such as a Ge—Se—As compound semiconductor material. The ovonic threshold switch material layer can include a first ovonic threshold switch material layer 144L which contains any ovonic threshold switch material. In one embodiment, the first ovonic threshold switch material layer 144L can include, and/or can consist essentially of, a GeSeAs alloy, a GeSe alloy, a SeAs alloy, a GeTe alloy, or a SiTe alloy.

In one embodiment, the material of the first ovonic threshold switch material layer 144L can be selected such that the resistivity of the first ovonic threshold switch material layer 144L decreases at least by two orders of magnitude (i.e., by more than a factor of 100) upon application of an external bias voltage that exceeds a critical bias voltage magnitude (also referred to as threshold voltage). In one embodiment, the composition and the thickness of the first ovonic threshold switch material layer 144L can be selected such that the critical bias voltage magnitude can be in a range from 1 V to 4 V, although lesser and greater voltages can also be employed for the critical bias voltage magnitude. The thickness of the first ovonic threshold switch material layer 144L can be, for example, in a range from 5 nm to 50 nm, such as from 10 nm to 30 nm, although lesser and greater thicknesses can also be employed.

The first selector layer 14L can include an optional first upper barrier material layer 146L overlying the first ovonic threshold switch material layer 144L and an optional first lower barrier material layer 142L underlying the first ovonic threshold switch material layer 144L. The optional first upper and/or lower barrier material layers (146L, 142L) include a material that suppresses diffusion of the material of the first ovonic threshold switch material layer 144L. For example, the first upper and/or lower barrier material layers (146L, 142L) can include amorphous carbon or diamond-like carbon (DLC). In one embodiment, the first upper barrier material layers 146L can include an upper amorphous carbon layer that contacts a top surface of the first ovonic threshold switch material layer 144L, and the first lower barrier material layer 142L can include a lower amorphous carbon layer that contacts a bottom surface of the first ovonic threshold switch material layer 144L. The thickness of the first upper barrier material layers 146L can be in a range from 4 nm to 40 nm, such as from 8 nm to 20 nm, although lesser and greater thicknesses can also be employed. The thickness of the first lower barrier material layer 142L can be in a range from 4 nm to 40 nm, such as from 8 nm to 20 nm, although lesser and greater thicknesses can also be employed.

The first phase change memory layer 16L includes a first phase change memory material layer 164L. The first phase change memory material layer 164L include a phase change memory material. As used herein, a "phase change memory material" refers to a material having at least two different phases providing different resistivity. The at least two different phases can be provided, for example, by controlling the rate of cooling from a heated state to provide an amorphous state having a higher resistivity and a polycrystalline state having a lower resistivity. In this case, the higher resistivity state of the phase change memory material can be achieved by faster quenching of the phase change memory material after heating to an amorphous state, and the lower resistivity state of the phase change memory material can be achieved by slower cooling of the phase change memory material after heating to the amorphous state Exemplary phase change memory materials include, but are not limited to, germanium antimony telluride compounds such as $Ge_2Sb_2Te_5$ (GST), germanium antimony compounds, indium germanium telluride compounds, aluminum selenium telluride compounds, indium selenium telluride compounds, and aluminum indium selenium telluride compounds. These compounds (e.g., compound semiconductor material) may be doped (e.g., nitrogen doped GST) or undoped. Thus, the phase change memory material layer can include, and/or can consist essentially of, a material selected from a germanium antimony telluride compound, a germanium antimony compound, an indium germanium telluride compound, an aluminum selenium telluride compound, an indium selenium telluride compound, or an aluminum indium selenium telluride compound. The thickness of the first phase change memory material layer 164L can be in a range from 1 nm to 60 nm, such as from 3 nm to 40 nm and/or from 10 nm to 25 nm, although lesser and greater thicknesses can also be employed.

The first phase change memory layer 16L can optionally include a first lower conductive liner layer 162L underlying the first phase change memory material layer 164L, and can optionally include a first upper conductive liner layer 166L overlying the first phase change memory material layer 164L. The optional first lower conductive liner layer 162L and/or the optional first upper conductive liner layer 166L, if present, include a conductive metallic material. In one embodiment, the first lower conductive liner layer 162L and/or the first upper conductive liner layer 166L can include a conductive metallic nitride such as titanium nitride, tantalum nitride, or tungsten nitride. The thickness of each of the first lower conductive liner layer 162L and the first upper conductive liner layer 166L can be in a range from 1 nm to 10 nm, such as from 1.5 nm to 5 nm, although lesser and greater thicknesses can also be employed.

The optional first barrier layer 17L, if present, includes a barrier material, and can be formed on top of the first phase change memory layer 16L. The barrier material is a material that can prevent diffusion of, and provide effective encapsulation of, the first phase change memory material. In one embodiment, the barrier material can include, and/or can consist essentially of, amorphous carbon. The thickness of the first barrier layer 17L can be in a range from 12 nm to 75 nm, such as from 20 nm to 60 nm, although lesser and grater thicknesses can also be employed.

The optional first hard mask layer 173L includes a hard mask material that can be employed as a planarization stopping structure in a subsequent planarization process. The first hard mask layer 173L can include a material selected from a metal, a dielectric material, or a semiconductor material. For example, the first hard mask layer 173L can include silicon nitride, a dielectric metal oxide, or a metal. In one embodiment, the first hard mask layer 173L can include silicon nitride. The thickness of the first hard mask layer 173L can be in a range from 3 nm to 30 nm, such as from 6 nm to 15 nm, although lesser and greater thicknesses can also be employed.

Referring to FIGS. 2A-2C, a first photoresist layer 197 can be applied over the first vertical stack (12L, 14L, 16L, 17L, 173L), and can be lithographically patterned to form a line and space pattern. For example, the first photoresist layer 197 can be patterned to form line trenches that laterally extend along the first horizontal direction hd1 and laterally spaced apart along the second horizontal direction hd2. The line trenches can have a uniform width that is invariant with translation along the first horizontal direction hd1. The pattern in the first photoresist layer 197 can be a periodic pattern that is repeated along the second horizontal direction hd2 with a pitch that is equal to the sum of the width of a line trench in the first photoresist layer 197 and the width of a patterned portion of the first photoresist layer 197. The pitch can be in a range from 32 nm to 600 nm, although lesser and greater pitches can also be employed.

An anisotropic etch process is performed employing the patterned portions of the first photoresist layer 197 as an etch mask. The anisotropic etch process etches through portions of the first vertical stack (12L, 14L, 16L, 17L, 173L) that are not masked by the first photoresist layer 197. The chemistry of the anisotropic etch process can be sequentially modified to etch through the various material layers of the first vertical stack (12L, 14L, 16L, 17L, 173L). The anisotropic etch process can stop at, or below, the top surface of the substrate 8. First trenches 11 laterally extending along the first horizontal direction hd1 are formed by the anisotropic etch. The first trenches 11 can be line trenches having a uniform vertical cross-sectional shape within vertical planes that are perpendicular to the first horizontal direction hd1. The uniform vertical cross-sectional shape of each first trench 11 can be invariant with translation along the first horizontal direction hd1. Each first trench 11 can vertically extend from the horizontal plane including the bottom surface of the first photoresist layer 197 to the horizontal plane including the top surface of the substrate 8. Each first trench 11 can have a vertical cross-sectional shape of an inverted trapezoid.

Remaining portions of the first vertical stack (12L, 14L, 16L, 17L, 173L) include first stacked rail structures (12, 14', 16', 17', 173'), each of which laterally extends along the first horizontal direction hd1. The first stacked rail structures (12, 14', 16', 17', 173') are laterally spaced apart by the first trenches 11 along the second horizontal direction hd2. As used herein, a "rail" or a "rail structure" refers to a structure that extends along a lengthwise direction, and optionally with a uniform cross-sectional shape within planes that are perpendicular to the lengthwise direction that is invariant under translation along the lengthwise direction. As used herein, a "stacked rail" or a "stacked rail structure" refers to a contiguous stack of at least two rails that laterally extend along a same lengthwise direction.

Each first stacked rail structure (12, 14', 16', 17', 173') includes, from bottom to top, a first conductive rail 12 that is a patterned portion of the first bottom conductive layer 12L, a first selector rail 14' that is a patterned portion of the first selector layer 14L, a first phase change memory rail 16' that is a patterned portion of the first phase change memory layer 16L, a first barrier rail 17' that is a patterned portion of the first barrier layer 17L, and an optional first hard mask strip 173' that is a patterned portion of the first hard mask layer 173L. As used herein, a "strip" refers to a rail having a thickness that is less than the width. The first stacked rail structures (12, 14', 16', 17', 173') laterally extend along the first horizontal direction hd1, are laterally spaced among one another by the first trenches 11, and are located over the substrate 8.

In one embodiment, each of the first conductive rails 12 can include a vertical stack of a first metal rail 122 that is a patterned portion of the first metal layer 122L and a first metal nitride strip 124 that is a patterned portion of the first metal nitride layer 124L. In one embodiment, each first selector rail 14' can include a vertical stack of a first lower barrier material strip 142', a first ovonic threshold switch material rail 144', and a first upper barrier material strip 146'. The first lower barrier material strip 142' is a patterned portion of an optional first lower barrier material layer 142L. The first ovonic threshold switch material rail 144' is a patterned portion of the first ovonic threshold switch material layer 144L. The first upper barrier material strip 146' is a patterned portion of the optional first upper barrier material layer 146L. In one embodiment, each first phase change memory rail 16' can include, from bottom to top, a first optional lower conductive liner strip 162', a first phase change memory material rail 164', and a first optional upper conductive liner strip 166'. Each first lower conductive liner strip 162' is a patterned portion of the first lower conductive liner layer 162L, each first phase change memory material rail 164' is a patterned portion of the first phase change memory material layer 164L, and each first upper conductive liner strip 166' is a patterned portion of the first upper conductive liner layer 166L. The first photoresist layer 197 can be subsequently removed, for example, by ashing. The first stacked rail structures (12, 14', 16', 17', 173') laterally extend along the first horizontal direction hd1, and are laterally spaced among one another by the first trenches 11 over the substrate 8.

Figure 3B:
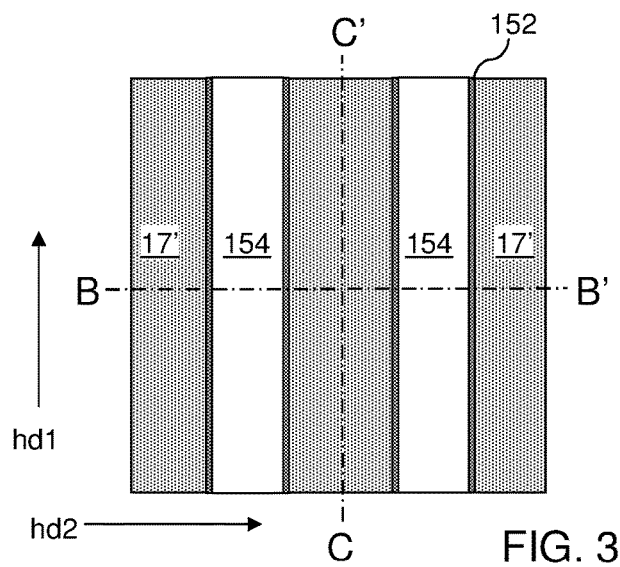
FIG. 3B is a vertical cross-sectional view of the exemplary structure along the vertical plane B-B' of FIG. 3A.
Figure 3C:
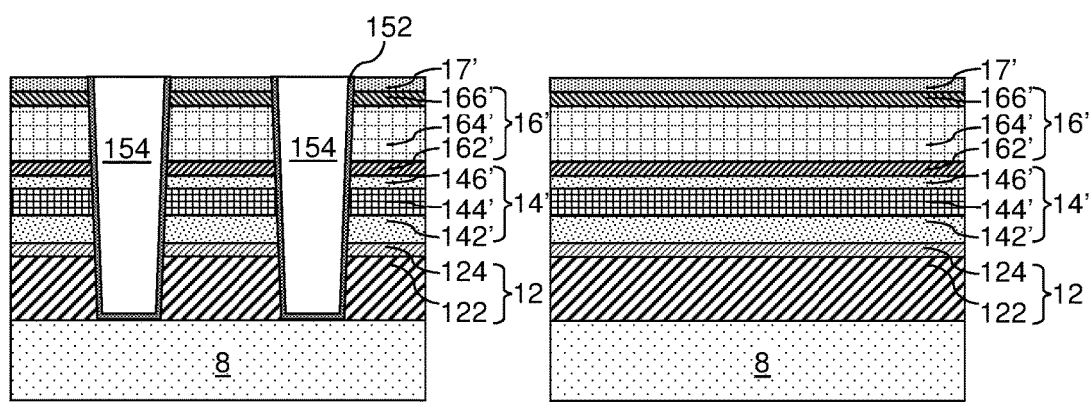
FIG. 3C is a vertical cross-sectional view of the exemplary structure along the vertical plane C-C' of FIG. 3A.

Referring to FIGS. 3A and 3B, a first continuous dielectric liner layer can be optionally deposited on sidewalls and bottom surfaces of the first trenches 11 and over the first hard mask strips 173'. The first continuous dielectric liner layer includes a dielectric material such as silicon nitride, a dielectric metal oxide (such as aluminum oxide), or silicon oxide. The first continuous dielectric liner layer can be deposited by a conformal deposition method such as chemical vapor deposition (CVD) or atomic layer deposition (ALD). The thickness of the first continuous dielectric liner layer can be in a range from 1 nm to 10 nm, such as from 2 nm to 6 nm, although lesser and greater thicknesses can also be employed. The first continuous dielectric liner layer includes a material different from the material of the first barrier rails 17'.

A first dielectric fill material layer can be deposited on the first continuous dielectric liner layer. The first dielectric fill material layer includes a planarizable dielectric material such as undoped silicate glass (e.g., silicon oxide), doped silicate glass, or a spin-on glass (SOG). The first dielectric fill material layer can be deposited by a conformal deposition method or by a self-planarizing deposition method (such as spin coating). In one embodiment, the first continuous dielectric liner layer can include, and/or can consist essentially of, a material selected from silicon nitride and a dielectric metal oxide, and the first dielectric fill material layer can include, and/or can consist essentially of, a material selected from doped silicate glass and undoped silicate glass.

Portions of the first continuous dielectric liner layer and the first dielectric fill material layer can be removed from above the horizontal plane including top surfaces of the first hard mask strips 173' by a planarization process. The planarization process can include chemical mechanical planarization (CMP) and/or a recess etch process. Each remaining portion of the first continuous dielectric liner layer constitutes a first dielectric liner 152, and each remaining portion of the first dielectric fill material layer constitutes a first dielectric fill material portion 154. Each contiguous set of a first dielectric liner 152 and a first dielectric fill material portion 154 constitutes a first dielectric isolation structure (152, 154), which is a dielectric isolation structure having a shape of a rail. A first dielectric isolation structure (152, 154) is formed in each of the first trenches 11 as a rail structure. The first dielectric isolation structures (152, 154) laterally extend along the first horizontal direction hd1, and are laterally spaced among one another along the second horizontal direction hd2. The top surfaces of the first dielectric isolation structures (152, 154) can be coplanar with the top surfaces of the first hard mask strips 173'.

If the first hard mask strips 173' are present, top surfaces of the first dielectric isolation structures (152, 154) can be recessed by an etch process, which can be an isotropic etch process or an anisotropic etch process. The duration of the etch process can be selected such that the recessed top surfaces of the first dielectric isolation structures (152, 154) is at about the level of the top surfaces of the first barrier rails 17'. The first hard mask strips 173' can be subsequently removed. For example, if the first hard mask strips 173' include silicon nitride, the first hard mask strips 173' can be removed by a wet etch employing hot phosphoric acid.

Referring to FIGS. 4A-4C, a first top conductive layer 18L can be formed over the one-dimensional array of first stacked rail structures (12, 14', 16', 17') spaced by the first dielectric isolation structures (152, 154). The first top conductive layer 18L includes at least one conductive material layer, which can be at least one metallic material layer. For example, the first top conductive layer 18L can include a metal layer (such as a tungsten layer). The thickness of the first top conductive layer 18L can be in a range from 20 nm to 100 nm, such as from 30 nm to 70 nm, although lesser and greater thicknesses can also be employed. The thickness of the first top conductive layer 18L can be in a range from 1 nm to 10 nm, such as from 1.5 nm to 5 nm, although lesser and greater thicknesses can also be employed.

A second photoresist layer 199 having a line and space pattern can be formed over the first top conductive layer 18L. Portions of the second photoresist layer 199 laterally extend along the second horizontal direction hd2 with a respective uniform width. Thus, line trenches are present among the portions of the second photoresist layer 199. The line trenches laterally extend along the second horizontal direction hd2, and are laterally spaced apart along the first horizontal direction hd1. The line trenches can have a uniform width that is invariant with translation along the second horizontal direction hd2. The pattern in the second photoresist layer 199 can be a periodic pattern that is repeated along the first horizontal direction hd1 with a pitch that is equal to the sum of the width of a line trench in the second photoresist layer 199 and the width of a patterned line-shaped portion of the second photoresist layer 199. The pitch can be in a range from 32 nm to 600 nm, although lesser and greater pitches can also be employed.

Figure 5A:
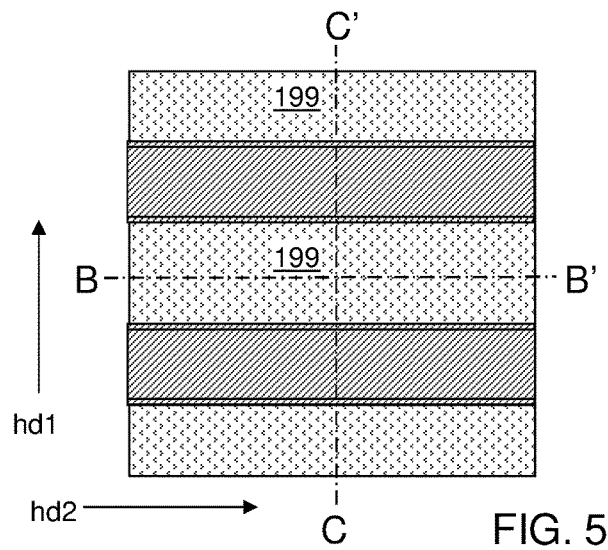
FIG. 5A is a vertical cross-sectional view of the exemplary structure after formation of second trenches through the first top conductive layer, the first stacked rail structures, and the first dielectric isolation structures and formation of second lower conductive rails according to an embodiment of the present disclosure.
Figure 5B:
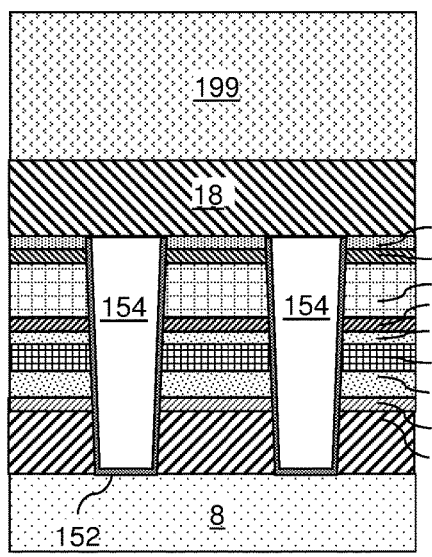
FIG. 5B is a vertical cross-sectional view of the exemplary structure along the vertical plane B-B' of FIG. 5A.
Figure 5C:
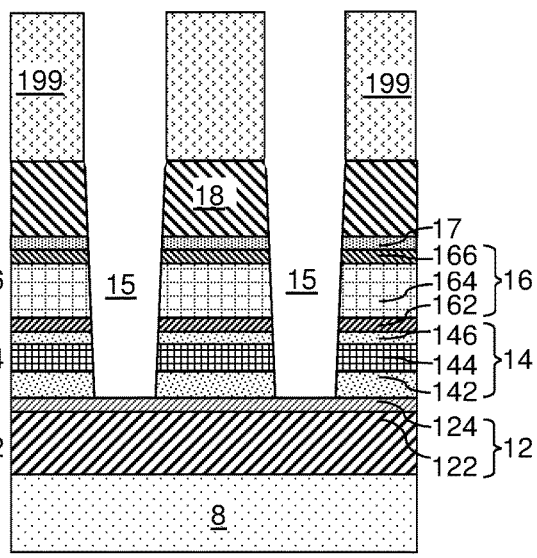
FIG. 5C is a vertical cross-sectional view of the exemplary structure along the vertical plane C-C' of FIG. 5A.

Referring to FIGS. 5A-5C, second trenches 15 are formed through the first top conductive layer 18L, the first stacked rail structures (12, 14', 16', 17'), and the first dielectric isolation structures (152, 154). An anisotropic etch process can be performed to etch portions of the first top conductive layer 18L, the first barrier rails 17', the first phase change memory rails 16', the first selector rails 14', and upper regions of the first dielectric isolation structures (152, 154) that are not masked by the second photoresist layer 199. The materials of the first top conductive layer 18L, the first barrier rails 17', the first phase change memory rails 16', the first selector rails 14', and the first dielectric isolation structures (152, 154) can be etched selective to the material in the top portions of the first conductive rails 12 by the anisotropic etch process. Volumes from which the materials of the first top conductive layer 18L, the first barrier rails 17', the first phase change memory rails 16', the first selector rails 14', and upper regions of the first dielectric isolation structures (152, 154) are removed constitute the second trenches 15. The second trenches 15 laterally extend along the second horizontal direction hd2.

The chemistry of the anisotropic etch process can be sequentially modified to etch through the various materials of the first top conductive layer 18L, the first barrier rails 17', the first phase change memory rails 16', the first selector rails 14', and the first dielectric isolation structures (152, 154). The anisotropic etch process can stop at the top surface of, or within, the first conductive rails 12. For example, the anisotropic etch process can stop on the first metal nitride strips 124. The second trenches 15 can be line trenches having a uniform vertical cross-sectional shape within vertical planes that are perpendicular to the second horizontal direction hd2. The uniform vertical cross-sectional shape of each second trench 15 can be invariant with translation along the second horizontal direction hd2. Each second trench 15 can vertically extend from the horizontal plane including the bottom surface of the second photoresist layer 199 to the horizontal plane including top surfaces of the first conductive rails 12 (which can be word lines for example). Each second trench 15 can have a vertical cross-sectional shape of an inverted trapezoid such that each second trench 15 has a pair of tapered lengthwise sidewalls and a lesser width at a bottom portion than at a top portion.

The first top conductive layer 18L is divided into a one-dimensional array of conductive rails, which are herein referred to as lower second conductive rail portions 18 (which can be portions of bit lines for example). Each lower second conductive rail portion 18 is subsequently incorporated into a respective second conductive rail that includes a respective upper second conductive rail portion to be subsequently formed thereabove.

Each vertical stack of a first barrier rail 17', a first phase change memory rails 16', and a first selector rails 14' is divided into a row of first memory pillar structures (14, 16, 17) that are laterally spaced apart long the first horizontal direction hd1. The combination of the first barrier rails 17', the first phase change memory rails 16', and the first selector rails 14' is divided into a two-dimensional array of first memory pillar structures (14, 16, 17), which may be a periodic two-dimensional array. The two-dimensional array of first memory pillar structures (14, 16, 17) can form a rectangular periodic two-dimensional array having a first pitch along the first horizontal direction hd1 and a second pitch along the second horizontal direction hd2.

As used herein, a "pillar" or a "pillar structure" refers to a structure that extends along a vertical direction such that each sidewall of the structure is vertical or is substantially vertical. As used herein, a sidewall is "substantially vertical" if the sidewall is tapered, i.e., tilted, with respect to a vertical direction by a tilt angle that is less than 10 degrees.

Each first memory pillar structure (14, 16, 17) includes, from bottom to top, a first selector pillar 14 that is a patterned portion of a first selector rail 14', a first phase change memory pillar 16 that is a patterned portion of a phase change memory rail 16', and an optional first barrier plate 17 that is a patterned portion of a first barrier strip 17'. As used herein, a "plate" refers to a structure with a vertical thickness (such as a uniform vertical thickness) that is less than the maximum lateral dimension of the structure in any horizontal direction.

Each first selector pillar 14 is a selector element, i.e., an element that provides non-linear voltage-current characteristics such that the element functions as a conductor under first voltage bias conditions and as an insulator under second voltage bias conditions. In one embodiment, each first selector pillar 14 can include a vertical stack of a first lower barrier material portion 142 that is a patterned portion of a first lower barrier material strip 142', a first ovonic threshold switch material portion 144 that is a patterned portion of a first ovonic threshold switch material rail 144', and a first upper barrier material portion 146 that is a patterned portion of a first upper barrier material strip 146'.

In one embodiment, each first selector pillar 14 includes a first ovonic threshold switch material portion 144, an upper amorphous carbon portion that contacts a top surface of the first ovonic threshold switch material portion 144 as a first upper barrier material portion 146, and a lower amorphous carbon portion that contacts a bottom surface of the first ovonic threshold switch material portion 144 as a first lower barrier material portion 142.

Each first phase change memory pillar 16 is a phase change memory element, i.e., a structure that changes the resistance depending on the phase of a material therein. In one embodiment, each first phase change memory pillar 16 can include a vertical stack of an optional first lower conductive liner plate 162 that is a patterned portion of a first optional lower conductive liner strip 162', a first phase change memory material pillar 164 that is a patterned portion of a first phase change memory material rail 164', and a first optional upper conductive liner plate 166 that is a patterned portion of a first upper conductive liner strip 166'.

Each first dielectric isolation structure (152, 154) has a laterally undulating height after the anisotropic etch process. Specifically, the height of each first dielectric isolation structure (152, 154) can be the same as the total thickness of a first stacked rail structure (12, 14', 16', 17') as provided at the processing steps of FIGS. 4A and 4B underneath each portion of the second photoresist layer 199, and can be about the same as the height (i.e., the thickness) of a first conductive rail 12 underneath each second trench 15. Each first dielectric isolation structure (152, 154) can continuously extend underneath a plurality of second trenches 15.

The first barrier plates 17 are barrier elements, and can be arranged in a two-dimensional periodic array. While FIGS. 5A-5C illustrate an embodiment in which a first phase change memory pillar 16 overlies a first selector pillar within each first memory pillar structure (14, 16, 17), embodiments are expressly contemplated herein in which a first phase change memory pillar 16 underlies a first selector pillar within each first memory pillar structure (14, 16, 17). In each case, if a first barrier plate 17' is present within a first memory pillar structure (14, 16, 17), a two-dimensional array of barrier elements (i.e., first barrier plates 17) may be disposed between the first phase change memory elements (i.e., the first phase change memory pillars 16) and a proximal set among a set of the first conductive rails 12 and a set of the lower second conductive rail portions 18.

Figure 6B:
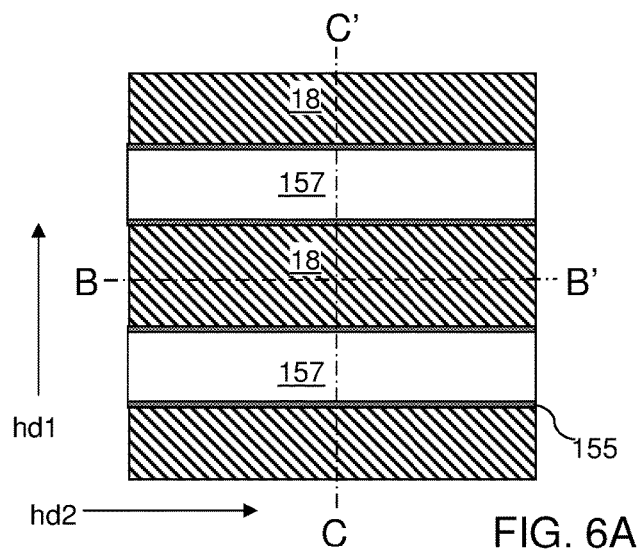
FIG. 6B is a vertical cross-sectional view of the exemplary structure along the vertical plane B-B' of FIG. 6A.
Figure 6C:
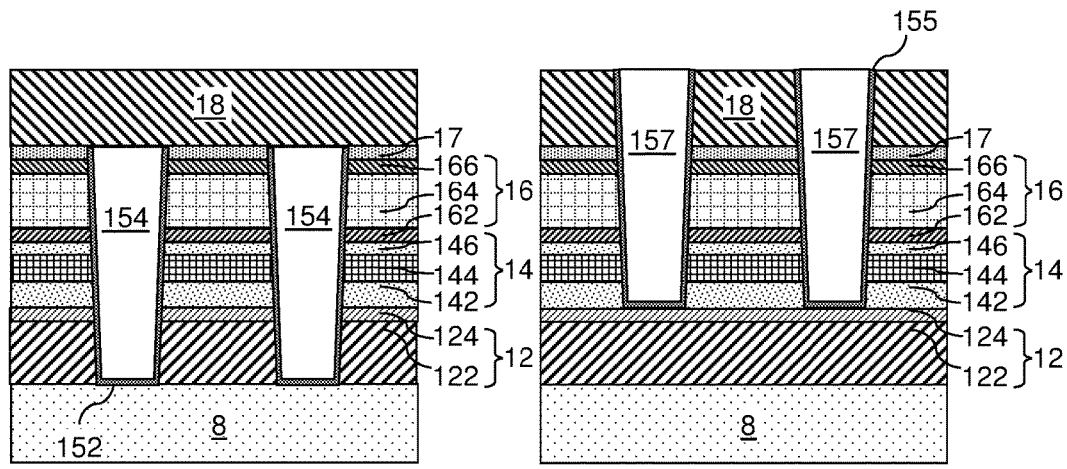
FIG. 6C is a vertical cross-sectional view of the exemplary structure along the vertical plane C-C' of FIG. 6A.

Referring to FIGS. 6A-6C, the second photoresist layer 199 can be subsequently removed, for example, by ashing. A first sacrificial dielectric liner layer can be optionally deposited on sidewalls and bottom surfaces of the second trenches 15 and over the lower second conductive rail portions 18. The first sacrificial dielectric liner layer includes a dielectric material such as silicon nitride, a dielectric metal oxide (such as aluminum oxide), or silicon oxide. The first sacrificial dielectric liner layer can be deposited by a conformal deposition method such as chemical vapor deposition (CVD) or atomic layer deposition (ALD). The thickness of the first sacrificial dielectric liner layer can be in a range from 1 nm to 10 nm, such as from 2 nm to 6 nm, although lesser and greater thicknesses can also be employed.

A first sacrificial fill material layer can be deposited on the first sacrificial dielectric liner layer. The first sacrificial fill material layer includes a planarizable dielectric material such as undoped silicate glass, doped silicate glass, or a spin-on glass (SOG). The first sacrificial fill material layer can be deposited by a conformal deposition method or by a self-planarizing deposition method (such as spin coating). In one embodiment, the first sacrificial dielectric liner layer can include, and/or can consist essentially of, a material selected from silicon nitride and a dielectric metal oxide, and the first sacrificial fill material layer can include, and/or can consist essentially of, a material selected from doped silicate glass and undoped silicate glass.

Portions of the first sacrificial dielectric liner layer and the first sacrificial fill material layer can be removed from above the horizontal plane including top surfaces of the lower second conductive rail portions 18 by a planarization process. The planarization process can include chemical mechanical planarization (CMP) and/or a recess etch process. Each remaining portion of the first sacrificial dielectric liner layer constitutes a first sacrificial liner 155, and each remaining portion of the first sacrificial fill material layer constitute a first sacrificial fill material portion 157. Each contiguous set of a first sacrificial liner 155 and a first sacrificial fill material portion 157 constitutes a first sacrificial trench fill structure (155, 157), which has a shape of a rail. A first sacrificial trench fill structure (155, 157) is formed in each of the second trenches 15 as a rail structure. The first sacrificial trench fill structures (155, 157) laterally extend along the second horizontal direction hd2, and are laterally spaced among one another along the first horizontal direction hd1. The top surfaces of the first sacrificial trench fill structures (155, 157) can be coplanar with the top surfaces of the lower second conductive rail portions 18.

Figure 7B:
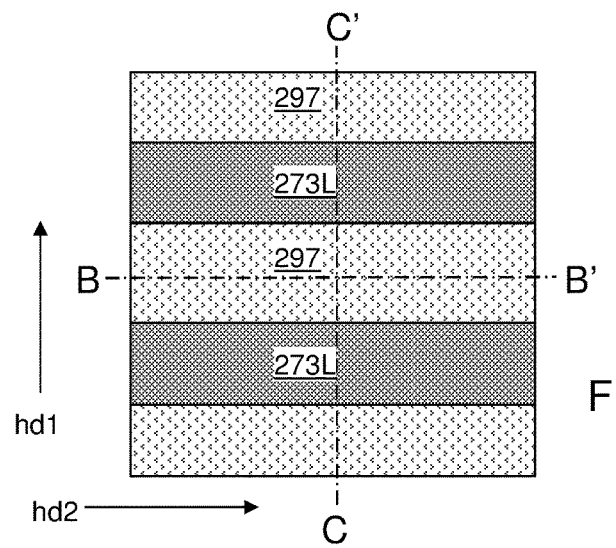
FIG. 7B is a vertical cross-sectional view of the exemplary structure along the vertical plane B-B' of FIG. 7A.
Figure 7C:
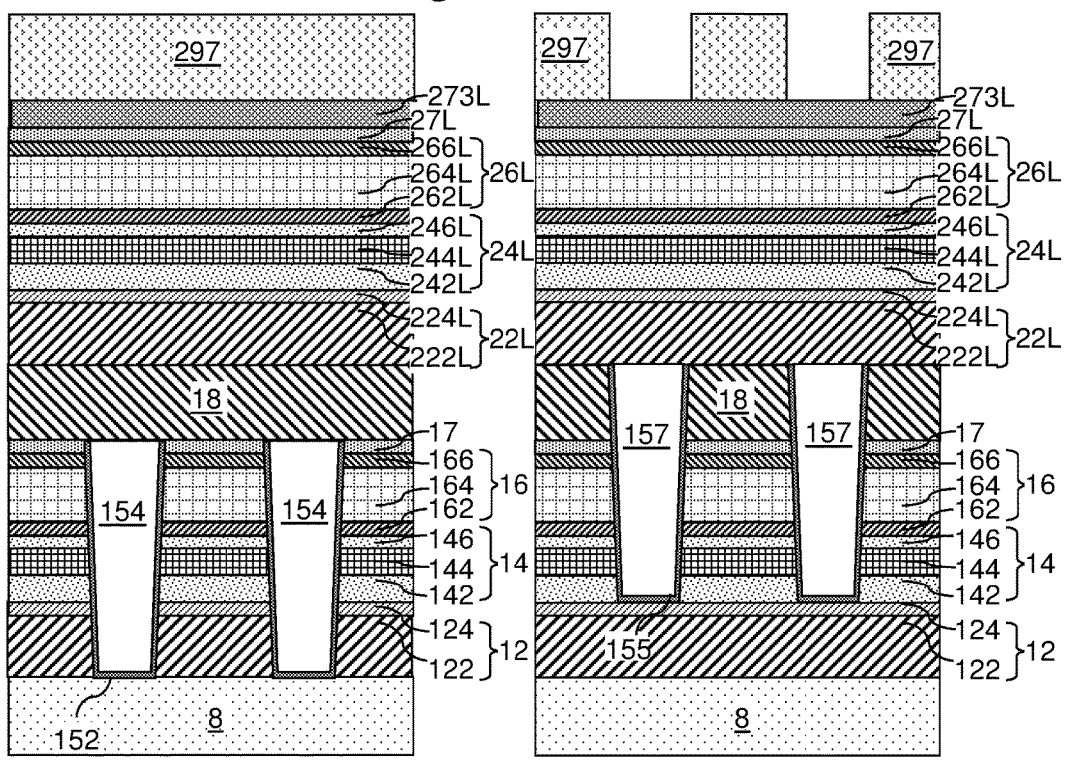
FIG. 7C is a vertical cross-sectional view of the exemplary structure along the vertical plane C-C' of FIG. 7A.

Referring to FIGS. 7A-7C, a second vertical stack (22L, 24L, 26L, 27L, 273L), which is also referred to as a second layer stack, is formed over the lower second conductive rail portions 18 and the first sacrificial trench fill structures (155, 157). The second vertical stack (22L, 24L, 26L, 27L, 273L) can include a second bottom conductive layer 22L, a second selector layer 24L, a second phase change memory layer 26L, an optional second barrier layer 27L, and an optional second hard mask layer 273L. Each layer in the second vertical stack (22L, 24L, 26L, 27L, 273L) can be formed as a blanket material layer.

The second bottom conductive layer 22L includes at least one conductive material layer, which can be at least one metallic material layer. For example, the second bottom conductive layer 22L can include a layer stack, from bottom to top, of a second metal layer 222L (such as a tungsten layer) and a second metal nitride layer 224L (such as a tungsten nitride layer or a titanium nitride layer). The thickness of the second metal layer 222L can be in a range from 20 nm to 200 nm, such as from 30 nm to 70 nm, although lesser and greater thicknesses can also be employed. The thickness of the second metal nitride layer 224L can be in a range from 2 nm to 20 nm, such as from 2.5 nm to 5 nm, although lesser and greater thicknesses can also be employed.

The second selector layer 24L includes a layer of a non-Ohmic material. The non-Ohmic material of the second selector layer 24L can be any of the non-Ohmic materials that may be employed for the first selector layer 14L. In one embodiment, the second selector layer 24L includes a second ovonic threshold switch material layer 244L. In one embodiment, the material of the second ovonic threshold switch material layer 244L can be selected such that the resistivity of the second ovonic threshold switch material layer 244L decreases at least by two orders of magnitude (i.e., by more than a factor of 100) upon application of an external bias voltage that exceeds a critical bias voltage magnitude. In one embodiment, the composition and the thickness of the second ovonic threshold switch material layer 244L can be selected such that the critical bias voltage magnitude can be in a range from 2 V to 4 V, although lesser and greater voltages can also be employed for the critical bias voltage magnitude. The thickness of the second ovonic threshold switch material layer 244L can be, for example, in a range from 5 nm to 50 nm, such as from 20 nm to 30 nm, although lesser and greater thicknesses can also be employed.

The second selector layer 24L can include an optional second upper barrier material layer 246L overlying the second ovonic threshold switch material layer 244L and an optional second lower barrier material layer 242L underlying the second ovonic threshold switch material layer 244L. The optional second upper and/or lower barrier material layers (246L, 242L) include a material that suppresses diffusion of the material of the second ovonic threshold switch material layer 244L. For example, the second upper and/or lower barrier material layers (246L, 242L) can include amorphous carbon or diamond-like carbon (DLC). In one embodiment, the second upper barrier material layers 246L can include an upper amorphous carbon layer that contacts a top surface of the second ovonic threshold switch material layer 244L, and the second lower barrier material layer 242L can include a lower amorphous carbon layer that contacts a bottom surface of the second ovonic threshold switch material layer 244L. The thickness of the second upper barrier material layers 246L can be in a range from 4 nm to 40 nm, such as from 8 nm to 20 nm, although lesser and greater thicknesses can also be employed. The thickness of the second lower barrier material layer 242L can be in a range from 4 nm to 40 nm, such as from 8 nm to 20 nm, although lesser and greater thicknesses can also be employed.

Alternatively or additionally, the second selector layer 24L may include an alternative non-Ohmic material layer such as a p-n or p-i-n junction diode layer. In this case, the second selector layer 24L becomes conductive only under electrical bias condition of one polarity, and becomes electrically non-conductive under electrical bias condition of the opposite polarity.

The second phase change memory layer 26L includes a second phase change memory material layer 264L. The second phase change memory material layer 264L include a phase change memory material. The phase change memory material of the second phase change memory material layer 264L can be any phase change memory material that may be employed for the first phase change memory material layer 164L. The thickness of the second phase change memory material layer 264L can be in a range from 2 nm to 60 nm, such as from 3 nm to 40 nm and/or from 10 nm to 25 nm, although lesser and greater thicknesses can also be employed.

The second phase change memory layer 26L can optionally include a second lower conductive liner layer 262L underlying the second phase change memory material layer 264L, and can optionally include a second upper conductive liner layer 266L overlying the second phase change memory material layer 264L. The optional second lower conductive liner layer 262L and/or the optional second upper conductive liner layer 266L, if present, include a conductive metallic material. In one embodiment, the second lower conductive liner layer 262L and/or the second upper conductive liner layer 266L can include a conductive metallic nitride such as titanium nitride, tantalum nitride, or tungsten nitride. The thickness of each of the second lower conductive liner layer 262L and the second upper conductive liner layer 266L can be in a range from 2 nm to 20 nm, such as from 2.5 nm to 5 nm, although lesser and greater thicknesses can also be employed.

The optional second barrier layer 27L, if present, includes a barrier material, and can be formed on top of the second phase change memory layer 26L. The barrier material is a material that can prevent diffusion of, and provide effective encapsulation of, the second phase change memory material. In one embodiment, the barrier material can include, and/or can consist essentially of, amorphous carbon. The thickness of each second barrier layer 27L can be in a range from 22 nm to 75 nm, such as from 20 nm to 60 nm, although lesser and grater thicknesses can also be employed.

The optional second hard mask layer 273L includes a hard mask material that can be employed as a planarization stopping structure in a subsequent planarization process. The second hard mask layer 273L can include a material selected from a metal, a dielectric material, or a semiconductor material. For example, the second hard mask layer 273L can include silicon nitride, a dielectric metal oxide, or a metal. In one embodiment, the second hard mask layer 273L can include silicon nitride. The thickness of the second hard mask layer 273L can be in a range from 3 nm to 30 nm, such as from 6 nm to 25 nm, although lesser and greater thicknesses can also be employed.

A third photoresist layer 297 can be applied over the second vertical stack (22L, 24L, 26L, 27L, 273L), and can be lithographically patterned to form a line and space pattern. For example, the third photoresist layer 297 can be patterned to form line trenches that laterally extend along the second horizontal direction hd2 and laterally spaced apart along the first horizontal direction hd1. The line trenches can have a uniform width that is invariant with translation along the second horizontal direction hd2. The pattern in the third photoresist layer 297 can be a periodic pattern that is repeated along the first horizontal direction hd1 with a pitch that is equal to the sum of the width of a line trench in the third photoresist layer 297 and the width of a patterned portion of the third photoresist layer 297. The pitch can be in a range from 32 nm to 600 nm, although lesser and greater pitches can also be employed. In one embodiment, the pattern of the third photoresist layer 297 can be the same as the pattern in the second photoresist layer 199.

Referring to FIGS. 8A-8C, an anisotropic etch process is performed employing the patterned portions of the third photoresist layer 297 as an etch mask. The anisotropic etch process etches through portions of the second vertical stack (22L, 24L, 26L, 27L, 273L) that are not masked by the third photoresist layer 297. The chemistry of the anisotropic etch process can be sequentially modified to etch through the various material layers of the second vertical stack (22L, 24L, 26L, 27L, 273L). The anisotropic etch process can stop at, or below, the top surface of the substrate 8. Third trenches 21 laterally extending along the second horizontal direction hd2 are formed by the anisotropic etch. The third trenches 21 can be line trenches having a uniform vertical cross-sectional shape within vertical planes that are perpendicular to the second horizontal direction hd2. The uniform vertical cross-sectional shape of each third trench 21 can be invariant with translation along the second horizontal direction hd2. Each third trench 21 can vertically extend from the horizontal plane including the bottom surface of the third photoresist layer 297 to the horizontal plane including the top surfaces of the first sacrificial trench fill structures (155, 157). Each third trench 21 can have a vertical cross-sectional shape of an inverted trapezoid.

Remaining portions of the second vertical stack (22L, 24L, 26L, 27L, 273L) include second stacked rail structures (22, 24', 26', 27', 273'), each of which laterally extends along the second horizontal direction hd2. The second stacked rail structures (22, 24', 26', 27', 273') are laterally spaced apart by the third trenches 21 along the first horizontal direction hd1.

Each second stacked rail structure (22, 24', 26', 27', 273') includes, from bottom to top, an upper second conductive rail portion 22 that is a patterned portion of the second bottom conductive layer 22L, a second selector rail 24' that is a patterned portion of the second selector layer 24L, a second phase change memory rail 26' that is a patterned portion of the second phase change memory layer 26L, a second barrier rail 27' that is a patterned portion of the second barrier layer 27L, and an optional second hard mask strip 273' that is a patterned portion of the second hard mask layer 273L. The second stacked rail structures (22, 24', 26', 27', 273') laterally extend along the second horizontal direction hd2, are laterally spaced among one another by the third trenches 21 along the first horizontal direction, and are located over a one-dimensional array of lower second conductive rail portions 18.

In one embodiment, each of the upper second conductive rail portions 22 can include a vertical stack of a second metal rail 222 that is a patterned portion of the second metal layer 212L and a second metal nitride strip 224 that is a patterned portion of the second metal nitride layer 224L. In one embodiment, each second selector rail 24' can include a vertical stack of a second lower barrier material strip 242', a second ovonic threshold switch material rail 244', and a second upper barrier material strip 246'. The second lower barrier material strip 242' is a patterned portion of an optional second lower barrier material layer 242L. The second ovonic threshold switch material rail 244' is a patterned portion of the second ovonic threshold switch material layer 244L. The second upper barrier material strip 246' is a patterned portion of the optional second upper barrier material layer 246L. In one embodiment, each second phase change memory rail 26' can include, from bottom to top, a second optional lower conductive liner strip 262', a second phase change memory material rail 264', and a second optional upper conductive liner strip 266'. Each second lower conductive liner strip 262' is a patterned portion of the second lower conductive liner layer 262L, each second phase change memory material rail 264' is a patterned portion of the second phase change memory material layer 264L, and each second upper conductive liner strip 266' is a patterned portion of the second upper conductive liner layer 266L. The second stacked rail structures (22, 24', 26', 27', 273') laterally extend along the second horizontal direction hd2, and are laterally spaced among one another by the third trenches 21 over the substrate 8.

Each vertical stack of a lower second conductive rail portion 18 and an upper second conductive rail portion 22 constitutes a second conductive rail (18, 22) that laterally extends along the second horizontal direction. The second conductive rails (18, 22) can be formed as a periodic one-dimensional array. In one embodiment, the width of the top surface of a lower second conductive rail portion 18 can be narrower than the width of the bottom surface of an upper second conductive rail portion 22 within each second conductive rail (18, 22). In this case, the sidewalls of each second conductive rail (18, 22) can have a laterally undulating vertical cross-sectional profile.

In the exemplary structure, the first conductive rails 12 (e.g., word lines) laterally extend along the first horizontal direction hd1. A rectangular array of first memory pillar structures (14, 16, 17) is provided on top surfaces of the first conductive rails 12. Second conductive rails (18, 22) (e.g., bit lines) laterally extend along the second horizontal direction hd2. The first conductive rails 12 and rows of the first memory pillar structures (14, 16, 17) are laterally spaced by first trenches 11, which are filled with the first dielectric isolation structures (152, 154). Lower portions of the second conductive rails (18, 22), i.e., lower second conductive rail portions 18, and columns of the first memory pillar structures (14, 16, 17) are laterally spaced by third trenches 21, which are filled with the first sacrificial trench fill structures (155, 157). Each first memory pillar structure (14, 16, 17) comprises a series connection of a respective first selector element 14 and a respective first phase change memory element 16. Vertical stacks of a second selector rail 24' and a second phase change memory rail 26' are formed over the second conductive rails (18, 22). The vertical stacks (24', 26') and upper portions of the second conductive rails (18, 22), i.e., the upper second conductive rail portions 22, are laterally spaced by third trenches 21 that laterally extend along the second horizontal direction hd2.

Referring to FIGS. 9A-9C, the first sacrificial trench fill structures (155, 157) can be removed to vertically extend the third trenches 21. In one embodiment, an anisotropic etch process that employs the third photoresist layer 297 can be performed to etch the material of the first sacrificial fill material portions 157. For example, if the first sacrificial fill material portions 157 include silicon oxide, a reactive ion etch process employing $CF_4$ and $O_2$ can be performed to remove the first sacrificial fill material portions 157. Alternatively, an isotropic etch process may be employed to remove the material of the first sacrificial fill material portions 157. For example, if the first sacrificial fill material portions 157 include silicon oxide, a wet etch employing hydrofluoric acid can be performed to remove the first sacrificial fill material portions 157. Subsequently, the first sacrificial liners 155 can be removed by another etch process, which may be an anisotropic etch process or an isotropic etch process. For example, if the first sacrificial liners 155 include silicon nitride, a wet etch employing hot phosphoric acid can be employed to remove the first sacrificial liners 155. The third photoresist layer 297 can be subsequently removed, for example, by ashing. Top surfaces of the first conductive rails 12 are physically exposed at the bottom of each third trench 21. Further, sidewalls and recessed top surfaces of the first dielectric isolation structures (152, 154) are physically exposed at a bottom portion of each third trench 21.

In an alternative embodiment, only the top portions of the first sacrificial trench fill structures (155, 157) can be removed (i.e., to only partially remove the first sacrificial trench fill structures (155, 157)) to vertically extend the third trenches 21. In this alternative embodiment, the top surface of the remaining first sacrificial trench fill structures (155, 157) is located below the optional barrier plate 17 such that the sidewalls of the second conductive rails (18, 22) are exposed in the third trenches 21.

Referring to FIGS. 10A-10C, sacrificial semiconductor structures 212 can be grown from the physically exposed surfaces of the second conductive rails (18, 22) within each third trench 21. Specifically, the sacrificial semiconductor structures 212 can be formed by selectively growing a semiconductor material from sidewalls of the second conductive rails (18, 22) while preventing growth of the semiconductor material from physically exposed sidewalls of the rectangular array of first memory pillar structures (14, 16, 17) and the vertical stacks including a respective second selector rail 24' and a respective second phase change memory rail 26'. In one embodiment, the lower second conductive rail portions 18 and the second metal rails 222 can consist essentially of an elemental metal or an intermetallic alloy that is conducive to select growth of a semiconductor material during a selective semiconductor deposition process that inhibits growth of the semiconductor material from insulating surfaces, the chalcogenide surfaces, the carbon surfaces or metallic nitride surfaces.

In an illustrative example, the lower second conductive rail portions 18 and the second metal rails 222 can consist essentially of tungsten, which is conducive to selective growth of a semiconductor material such as amorphous silicon, polysilicon, or a silicon-germanium alloy therefrom while the semiconductor material does not grow from the surfaces of the surfaces of the first metal nitride strips 124, the second metal nitride strips 224, the first dielectric isolation structures (152, 154), the first selector pillars 14, the first phase change memory pillars 16, the first barrier plates 17, the second selector rails 24', the second phase change memory rails 26', the second barrier rails 27', and the optional second hard mask strips 273'.

The selective semiconductor deposition process that can be employed to form the sacrificial semiconductor structures 212 can be a low pressure chemical vapor deposition process in which a reactant and an etchant are simultaneously or alternately flowed into a process chamber including the exemplary structure. The reactant can include one or more of silane, disilane, dichlorosilane, trichlorosilane, germane, and digermane, and the etchant can include gas phase hydrogen chloride. The reaction temperature can be in a range from 450 degrees Celsius to 900 degrees Celsius, such as from 500 degrees Celsius to 700 degrees Celsius. The partial pressure of the reactant can be in a range from 1 mTorr to 1 Torr, and the partial pressure of the etchant can be in a range from 1 mTorr to 1 Torr. A carrier gas such as hydrogen or nitrogen may be employed to increase the total pressure during processing to a range from 200 mTorr to 200 Torr. The semiconductor material has a greater growth rate on metal surfaces (such as tungsten surfaces) of the lower second conductive rail portions 18 and the second metal rails 222 than on surfaces of metal nitride materials, the surfaces of chalcogenide materials, the surfaces of the carbon material, surfaces of metallic nitride material or surfaces of dielectric materials. The flow rate of the etchant is selected such that the etch rate provided by the etchant is greater than the deposition rate on surfaces of metal nitride materials, the surfaces of chalcogenide materials, the surfaces of the carbon material, surfaces of metallic nitride material or surfaces of dielectric materials than on the metal surfaces of the lower second conductive rail portions 18 and the second metal rails 222. Thus, deposition of the semiconductor material proceeds only from the surfaces of the lower second conductive rail portions 18 and the second metal rails 222.

The duration of the selective semiconductor deposition process is selected such that two sacrificial semiconductor structures 212 that grow from opposite sides within each third trench 21 merge to form a seam along a center vertical plane of the third trench 21 that extend along the second horizontal direction hd2. A sealed cavity 211 extending along the second horizontal direction hd2 is formed underneath each adjoined pair of sacrificial semiconductor structures 212, and a recess cavity 213 extending along the second horizontal direction hd2 is formed above each adjoined pair of sacrificial semiconductor structures 212. As used herein, a cavity refers to a continuous volume that is free of any solid material portion therein. A cavity may be filled with a gas phase material only, or may be under vacuum. As used herein, a "sealed cavity" or an "encapsulated cavity" refers to a cavity bounded by a set of solid surfaces that do not include any opening therein. A sealed cavity or an encapsulated cavity is defined entirely by surfaces of a sealed volume. A recess cavity refers to a cavity that extends downward from en empty volume located above. Each sacrificial semiconductor structure 212 can have an upper convex surface that laterally extends along the second horizontal direction hd2, and a lower convex surface that laterally extends along the second horizontal direction hd2. Generally, a pair of sacrificial semiconductor structures 212 can be formed within each third trench 21 by selective growth of the semiconductor material. Convex surfaces (such as the upper convex surfaces) of the pair of sacrificial semiconductor structures 212 can be adjoined to provide an edge that extend along the second horizontal direction hd2 within each third trench 21.

Figure 11A:
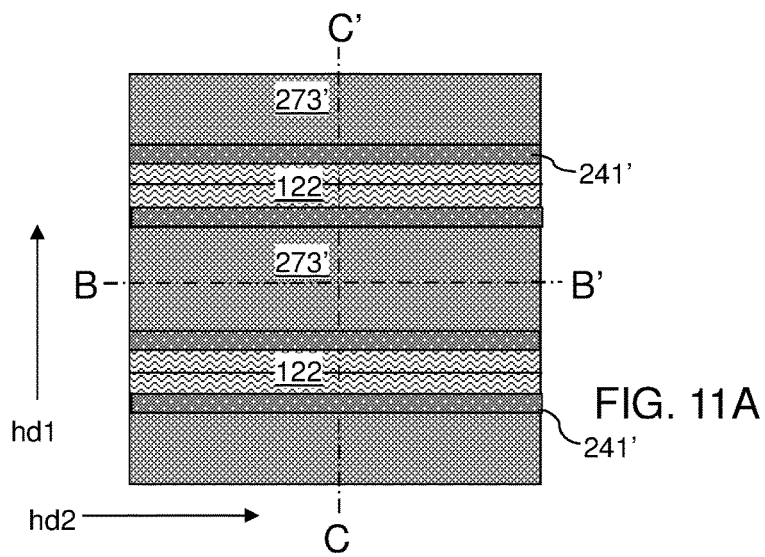
FIG. 11A is a top-down view of the exemplary structure after formation of dielectric liners in upper portions of the third trenches according to an embodiment of the present disclosure.
Figures 11B, 11C:
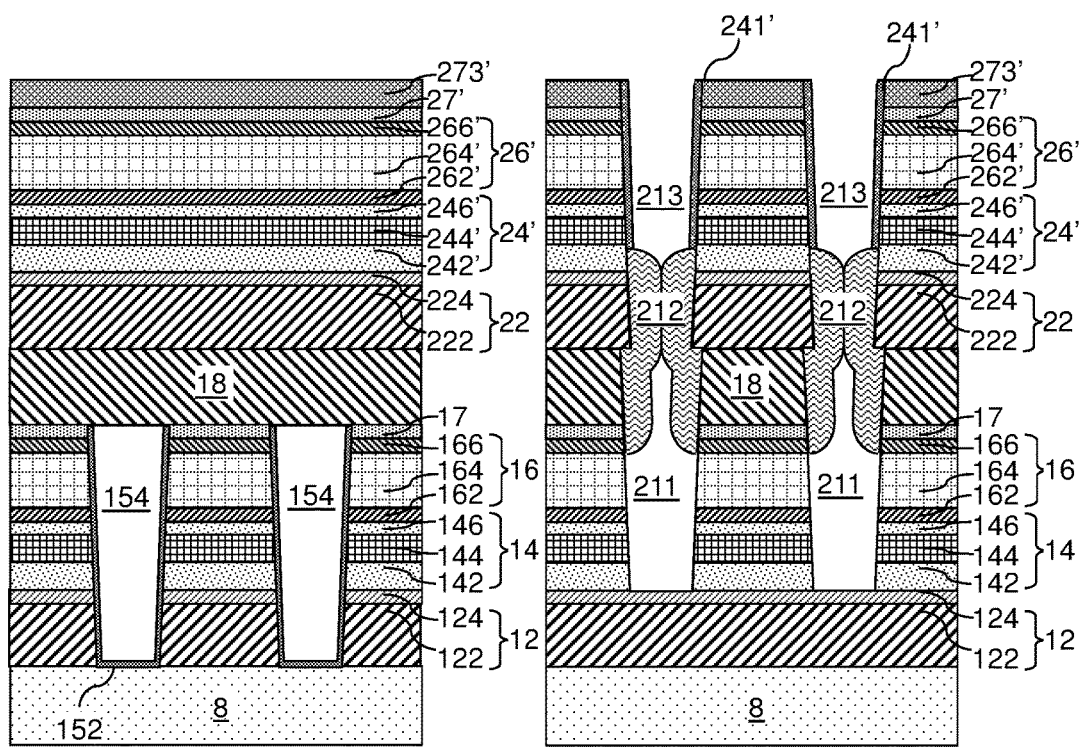
FIG. 11B is a vertical cross-sectional view of the exemplary structure along the vertical plane B-B' of FIG. 11A.
FIG. 11C is a vertical cross-sectional view of the exemplary structure along the vertical plane C-C' of FIG. 11A.

Referring to FIGS. 11A-11C, a conformal dielectric material layer is deposited in the recess trenches 213, which are upper portions of the third trenches 21 that overlie the sacrificial semiconductor structures 212. The conformal dielectric material layer includes a dielectric material such as silicon nitride. The thickness of the conformal dielectric material layer can be in a range from 1 nm to 12 nm, such as from 1.5 nm to 6 nm, although lesser and greater thicknesses can also be employed. The conformal dielectric material layer can be deposited, for example, by low pressure chemical vapor deposition process.

An anisotropic etch process can be performed to remove horizontal portions of the conformal dielectric material layer. Remaining portions of the conformal dielectric material layer after the anisotropic etch process constitute dielectric liners 241'. The dielectric liners 241' are formed on the sidewalls of the recess trenches 213, which are upper portions of the third trenches 21 that overlie the sacrificial semiconductor structures 212.

Figure 12A:
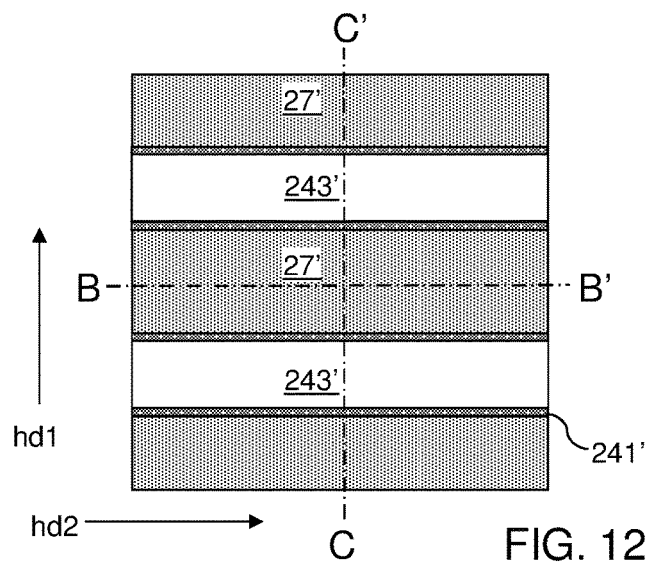
FIG. 12A is a top-down view of the exemplary structure after formation of second dielectric isolation structures according to an embodiment of the present disclosure.
Figures 12B, 12C:
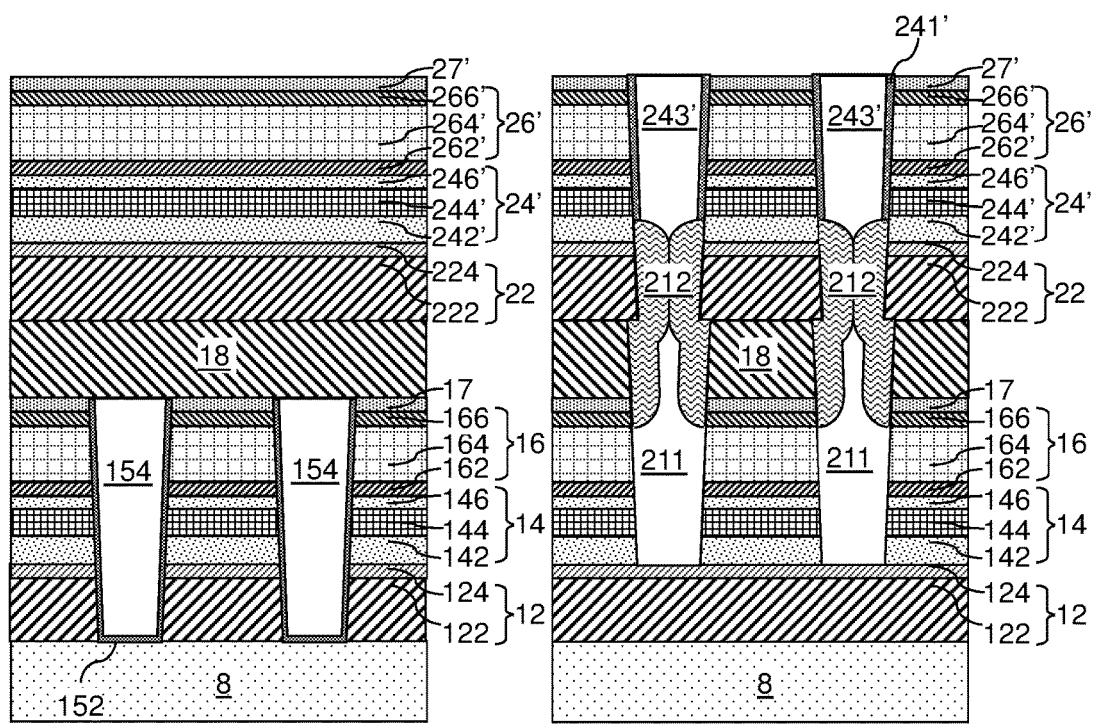
FIG. 12B is a vertical cross-sectional view of the exemplary structure along the vertical plane B-B' of FIG. 12A.
FIG. 12C is a vertical cross-sectional view of the exemplary structure along the vertical plane C-C' of FIG. 12A.
Figure 15A:
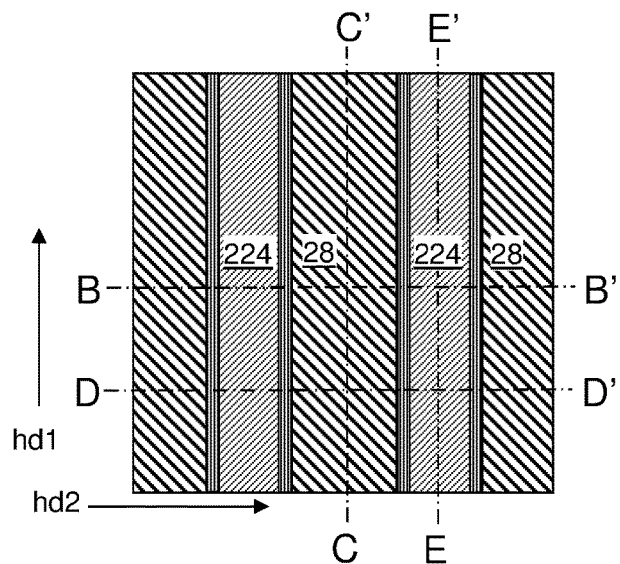
FIG. 15A is a vertical cross-sectional view of the exemplary structure after removal of the sacrificial semiconductor structures to form first cavities according to an embodiment of the present disclosure.
Figures 15B, 15C:
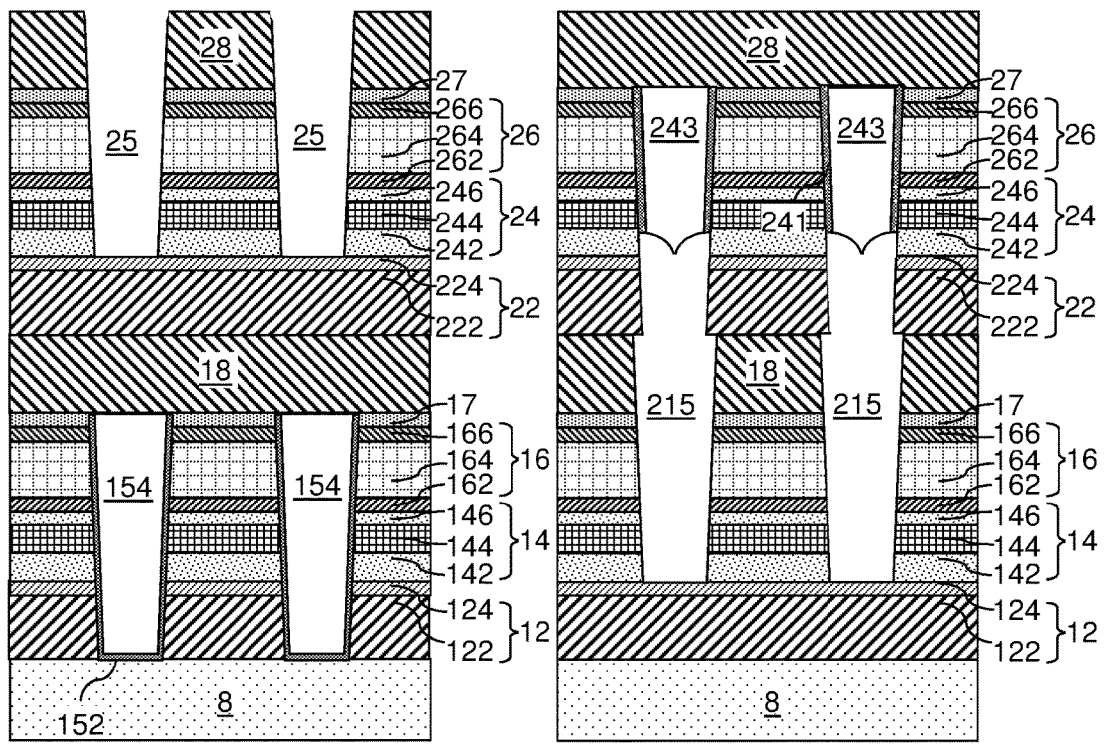
FIG. 15B is a vertical cross-sectional view of the exemplary structure along the vertical plane B-B' of FIG. 15A.
FIG. 15C is a vertical cross-sectional view of the exemplary structure along the vertical plane C-C' of FIG. 15A.
Figure 15D:
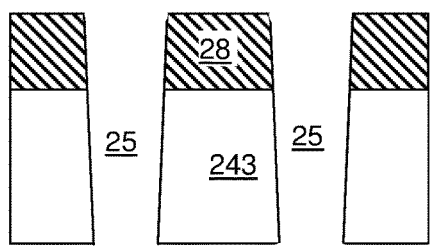
FIG. 15D is a vertical cross-sectional view of the exemplary structure along the vertical plane D-D' of FIG. 15A.
Figure 15D:
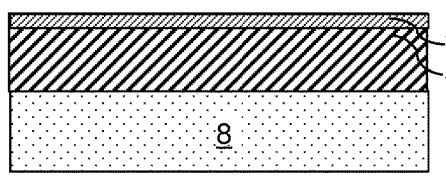
Figure 15E:
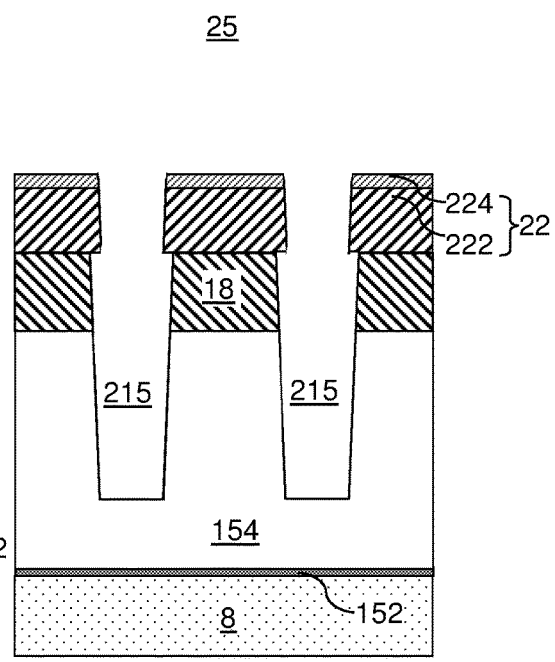
FIG. 15E is a vertical cross-sectional view of the exemplary structure along the vertical plane E-E' of FIG. 15A.

Referring to FIGS. 12A-12C, a dielectric fill material can be deposited on the dielectric liners 241' to fill the recess trenches 213. The dielectric fill material can be a planarizable dielectric material such as undoped silicate glass, doped silicate glass, or a spin-on glass (SOG). The dielectric fill material can be deposited by a conformal deposition method or by a self-planarizing deposition method (such as spin coating). In one embodiment, the dielectric fill material can include, and/or can consist essentially of, a material selected from doped silicate glass and undoped silicate glass.

Portions of the dielectric fill material can be removed from above the horizontal plane including top surfaces of the second hard mask strips 273' by a planarization process. The planarization process can include chemical mechanical planarization (CMP) and/or a recess etch process. Each remaining portion of the dielectric fill material constitutes a dielectric fill material portion 243'. Each contiguous set of a dielectric liner 241' and a dielectric fill material portion 243' constitutes a second dielectric isolation structure (241', 243'), which is a dielectric isolation structure having a shape of a rail. A second dielectric isolation structure (241', 243') is formed in an upper portion of each third trench 21 above a respective pair of sacrificial semiconductor structures 212 as a rail structure. The second dielectric isolation structures (241', 243') laterally extend along the second horizontal direction hd2, and are laterally spaced among one another along the first horizontal direction hd1. The top surfaces of the second dielectric isolation structures (241', 243') can be coplanar with the top surfaces of the second hard mask strips 273'.

If the second hard mask strips 273' are present, top surfaces of the second dielectric isolation structures (241', 243') can be recessed by an etch process, which can be an isotropic etch process or an anisotropic etch process. The duration of the etch process can be selected such that the recessed top surfaces of the second dielectric isolation structures (241', 243') is at about the level of the top surfaces of the second barrier rails 27'. The second hard mask strips 273' can be subsequently removed. For example, if the second hard mask strips 273' include silicon nitride, the second hard mask strips 273' can be removed by a wet etch employing hot phosphoric acid.

The second dielectric isolation structures (241', 243') are formed in the third trenches 21 as dielectric isolation rail structures that laterally extend along the second horizontal direction hd2. The second dielectric isolation structures (241', 243') are formed on the convex surfaces of the sacrificial semiconductor structures 212.

Referring to FIGS. 13A-13E, a second top conductive layer 28L can be formed over the one-dimensional array of second stacked rail structures (22, 24', 26', 27') spaced by the second dielectric isolation structures (241', 243'). The second top conductive layer 28L includes at least one conductive material layer, which can be at least one metallic material layer. For example, the second top conductive layer 28L can include a metal layer (such as a tungsten layer). The thickness of the second top conductive layer 28L can be in a range from 20 nm to 200 nm, such as from 30 nm to 70 nm, although lesser and greater thicknesses can also be employed.

A fourth photoresist layer 299 having a line and space pattern can be formed over the second top conductive layer 28L. Portions of the fourth photoresist layer 299 laterally extend along the first horizontal direction hd1 with a respective uniform width. Thus, line trenches are present among the portions of the fourth photoresist layer 299. The line trenches laterally extend along the first horizontal direction hd1, and are laterally spaced apart along the second horizontal direction hd2. The line trenches can have a uniform width that is invariant with translation along the first horizontal direction hd1. The pattern in the fourth photoresist layer 299 can be a periodic pattern that is repeated along the second horizontal direction hd2 with a pitch that is equal to the sum of the width of a line trench in the fourth photoresist layer 299 and the width of a patterned line-shaped portion of the fourth photoresist layer 299. The pitch can be in a range from 32 nm to 600 nm, although lesser and greater pitches can also be employed. In one embodiment, the pattern of the fourth photoresist layer 299 can be the same as the pattern of the first conductive rails 12.

Referring to FIGS. 14A-14E, fourth trenches 25 are formed through the second top conductive layer 28L, vertical stacks (24', 26', 27') of a second selector rail 24', a second phase change memory rail 26', and an optional second barrier rail 27', and the second dielectric isolation structures (241', 243'). An anisotropic etch process can be performed to etch portions of the second top conductive layer 28L, the second barrier rails 27', the second phase change memory rails 26', the second selector rails 24', and the second dielectric isolation structures (241', 243') that are not masked by the fourth photoresist layer 299. The materials of the second top conductive layer 28L, the second barrier rails 27', the second phase change memory rails 26', the second selector rails 24', and the second dielectric isolation structures (241', 243') can be etched selective to the material in the top portions of the second conductive rails (18, 22) (for example, selective to the second metallic nitride strips 224) by the anisotropic etch process. Volumes from which the materials of the second top conductive layer 28L, the second barrier rails 27', the second phase change memory rails 26', the second selector rails 24', and the second dielectric isolation structures (241', 243') are removed constitute the fourth trenches 25. The fourth trenches 25 laterally extend along the first horizontal direction hd1. Surfaces of the sacrificial semiconductor portions 212 are physically exposed within each of the fourth trenches 25.

The chemistry of the anisotropic etch process can be sequentially modified to etch through the various materials of the second top conductive layer 28L, the second barrier rails 27', the second phase change memory rails 26', the second selector rails 24', and the second dielectric isolation structures (241', 243'). The anisotropic etch process can stop at the top surface of, or within, the second conductive rails (18, 22). For example, the anisotropic etch process can stop on the second metal nitride strips 224. The sacrificial semiconductor structures 212 may be partially etched by the anisotropic etch process. Each fourth trench 25 can vertically extend from the horizontal plane including the bottom surface of the fourth photoresist layer 299 to the horizontal plane including top surfaces of the second conductive rails (18, 22) or to the top surfaces of the sacrificial semiconductor structures 212.

The second top conductive layer 28L is divided into a one-dimensional array of conductive rails, which are herein referred to as lower third conductive rail portions 28. Each lower third conductive rail portion 28 can be subsequently incorporated into a respective third conductive rail that includes a respective upper third conductive rail portion to be subsequently formed thereabove. Alternatively, if the level of the second top conductive layer 28L is the level of the topmost conductive rail structures, the one-dimensional array of conductive rails can constitute third conductive rails (e.g., word lines).

Each vertical stack of a second barrier rail 27', a second phase change memory rails 26', and a second selector rails 24' is divided into a row of second memory pillar structures (24, 26, 27) that are laterally spaced apart long the second horizontal direction hd2. The combination of the second barrier rails 27', the second phase change memory rails 26', and the second selector rails 24' is divided into a two-dimensional array of second memory pillar structures (24, 26, 27), which may be a periodic two-dimensional array. The two-dimensional array of second memory pillar structures (24, 26, 27) can form a rectangular periodic two-dimensional array having the first pitch along the first horizontal direction hd1 and the second pitch along the second horizontal direction hd2.

Each second memory pillar structure (24, 26, 27) includes, from bottom to top, a second selector pillar 24 that is a patterned portion of a second selector rail 24', a second phase change memory pillar 26 that is a patterned portion of a phase change memory rail 26', and an optional second barrier plate 27 that is a patterned portion of a second barrier strip 27'. The second memory pillar structures (24, 26, 27) can be arranged as a rectangular two-dimensional array.

Each second selector pillar 24 is a selector element. In one embodiment, each second selector pillar 24 can include a vertical stack of a second lower barrier material portion 242 that is a patterned portion of a second lower barrier material strip 242', a second ovonic threshold switch material portion 244 that is a patterned portion of a second ovonic threshold switch material rail 244', and a second upper barrier material portion 246 that is a patterned portion of a second upper barrier material strip 246'.

In one embodiment, each second selector pillar 24 includes a second ovonic threshold switch material portion 244, an upper amorphous carbon portion that contacts a top surface of the second ovonic threshold switch material portion 244 as a second upper barrier material portion 246, and a lower amorphous carbon portion that contacts a bottom surface of the second ovonic threshold switch material portion 244 as a second lower barrier material portion 242.

Each second phase change memory pillar 26 is a phase change memory element. In one embodiment, each second phase change memory pillar 26 can include a vertical stack of an optional second lower conductive liner plate 262 that is a patterned portion of a second optional lower conductive liner strip 262', a second phase change memory material pillar 264 that is a patterned portion of a second phase change memory material rail 264', and a second optional upper conductive liner plate 266 that is a patterned portion of a second upper conductive liner strip 266'.

The fourth trenches 25 divide the second dielectric isolation structures (241', 243') into a two-dimensional array of dielectric isolation pillar structures (241, 243). Each second dielectric isolation structure (241', 243') is divided into a one-dimensional array of dielectric isolation pillar structures (241, 243). A two-dimensional array of dielectric isolation pillar structures (241, 243) can be formed. Each dielectric isolation pillar structure (241, 243) can include a pair of dielectric liner segments 241 that are patterned portions of dielectric liners 241', and a dielectric pillar 243 that is a patterned portion of a dielectric fill material portion 243'.

The second barrier plates 27 are barrier elements, and can be arranged in a two-dimensional periodic array. While FIGS. 14A-14E illustrate an embodiment in which a second phase change memory pillar 26 overlies a second selector pillar within each second memory pillar structure (24, 26, 27), embodiments are expressly contemplated herein in which a second phase change memory pillar 26 underlies a second selector pillar within each second memory pillar structure (24, 26, 27). In each case, if a second barrier plate 27' is present within a second memory pillar structure (24, 26, 27), a two-dimensional array of barrier elements (i.e., second barrier plates 27) may be disposed between the second phase change memory elements (i.e., the second phase change memory pillars 26) and a proximal set among a set of the second conductive rails (18, 22) and a set of the lower third conductive rail portions 28 (or third conductive rails).

Referring to FIGS. 15A-15E, the sacrificial semiconductor structures 212 are removed from underneath the fourth trenches 25 selective to the remainder of the exemplary structure by an isotropic etch process. The sacrificial semiconductor structures 212 are removed from underneath the two-dimensional array of dielectric isolation pillar structures (241, 243) selective to the materials of the dielectric isolation pillar structures (241, 243) to form a one-dimensional array of first cavities 215. Each first cavity 215 laterally extends along the second horizontal direction hd2 underneath a row of dielectric isolation pillar structures (241, 243) that are arranged along the second horizontal direction hd2.

The selective isotropic etch process etches the material of the sacrificial semiconductor structures 212 selective to the remainder of the exemplary structure. As used herein, a "selective" etch process is an etch process that etches a first material with a first etch rate without etching a second material or while etching the second material at a second etch rate such that the ratio of the first etch rate to the second etch rate is at least 3. If the second etch rate is finite, the ratio of the first etch rate to the second etch rate is referred to as the "selectivity" of the etch process. In this case, the selective etch process etches the first material "selective to" the second material. The selectivity of the selective etch process is at least 3, and can be in a range from 3 to 100,000 such as from 10 to 1,000. A wet etch employing a KOH solution or a trimethyl(2-hydroxyethyl)ammonium hydroxide (TMY) solution can be used to selectively etch polysilicon or amorphous silicon sacrificial semiconductor structures 212.

An upper portion of each first cavity 215 is joined to lower portions of a plurality of fourth cavities 25. A lower portion of each fourth cavity 25 is jointed can be joined to an upper portion of each first cavity 215 within the one-dimensional array of first cavities 215. Each first cavity 215 can vertically extend at least from a first horizontal plane including interfaces between the first selector elements 14 and the first phase change memory elements 16 to a second horizontal plane including bottom surfaces of the second conductive rails (18, 22). In one embodiment, each first cavity 215 can vertically extend from top surfaces of the first conductive rails 12 to a horizontal plane including top surfaces of the second conductive rails (18, 22). In one embodiment, each first cavity 215 can vertically extend from top surfaces of the first metal nitride strips 122 to the horizontal plane including top surfaces of the second conductive rails (18, 22). In one embodiment, the second conductive rails (18, 22) can be laterally spaced among one another by the one-dimensional array of first cavities 215.

Each dielectric isolation pillar structure (241, 243) can include a pair of concave bottom surfaces that are adjoined by a ridge extending along the second horizontal direction hd2. Each concave bottom surface of the dielectric isolation pillar structures (241, 243) can be physically exposed to a respective one of the first cavities 215.

Referring to FIGS. 16A-16E, an outer dielectric liner 252 can be deposited on the physically exposed surfaces of the exemplary structure. The physically exposed surfaces on which the outer dielectric liner 252 is deposited include sidewalls of the first memory pillar structures (14, 16, 17) that are parallel to the second horizontal direction hd2, sidewalls of the second memory pillar structures (24, 26, 27) that are parallel to the first horizontal direction hd1, sidewalls of the second conductive rails (18, 22) that extend along the second horizontal direction hd2, and sidewalls of the lower third conductive rail portions 18 (or of third conductive rails) that extend along the first horizontal direction hd1. The outer dielectric liner 252 is deposited on bottom surfaces of the dielectric isolation pillar structures (241, 243), which become physically exposed after removal of the sacrificial semiconductor structures 212. Thus, the outer dielectric liner 253 is deposited on bottom surfaces of the dielectric liner segments 241, and on each pair of concave bottom surfaces of the dielectric pillars 243. The outer dielectric liner 252 can be formed by a conformal deposition process such as low pressure chemical vapor deposition (LPCVD). The outer dielectric liner 252 includes a dielectric material that can protect and/or passivate the materials of the first memory pillar structures (14, 16, 17) and the second memory pillar structures (24, 26, 27). For example, the outer dielectric liner 252 can include silicon nitride. The thickness of the outer dielectric liner 252 can be in a range from 1 nm to 10 nm, such as from 2 nm to 5 nm, although lesser and greater thicknesses can also be employed.

Referring to FIGS. 17A-17E, a dielectric fill material can be non-conformally deposited to form a dielectric fill material layer 254L. The dielectric fill material can include, for example, undoped silicate glass or doped silicate glass. The non-conformal deposition process employed to deposit the dielectric fill material can be, for example, physical vapor deposition, plasma enhanced chemical vapor deposition (PECVD), vacuum evaporation, or any directional dielectric material deposition process. The dielectric fill material can be deposited in portions of the first cavities 215 that underlie the fourth trenches 25, i.e., within portions of the first cavities 215 that overlap in area with overlying fourth trenches 25. The regions of the dielectric fill material layer 254L that is deposited on the sidewalls of the outer dielectric liner 252 around remaining volumes of the first cavities 215 are herein referred to as inner dielectric liners 254I. Depending on the degree of anisotropy in the deposition of the dielectric fill material, the inner dielectric liners 254I may continuously extend along the second horizontal direction hd2 to continuously cover sidewalls of the outer dielectric liner 252 within each first cavity 215, or may be formed as discrete portions that are discontinuous underneath the dielectric isolation pillar structures (241, 243). The inner sidewalls of the first cavities 215 may, or may not, be physically exposed to the remaining portions of the first cavities 215 depending on the anisotropy of the deposition process that deposits the dielectric fill material.

Figure 17A:
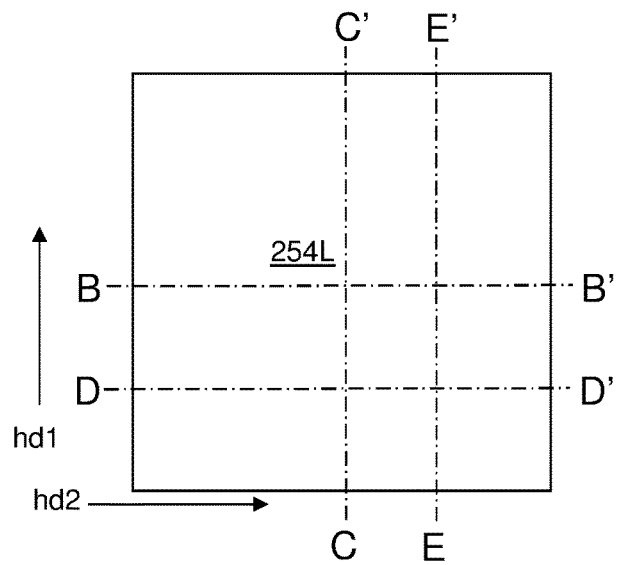
FIG. 17A is a vertical cross-sectional view of the exemplary structure after non-conformal deposition of a dielectric fill material to form an inner dielectric liner around each first cavity according to an embodiment of the present disclosure.
Figure 17B:
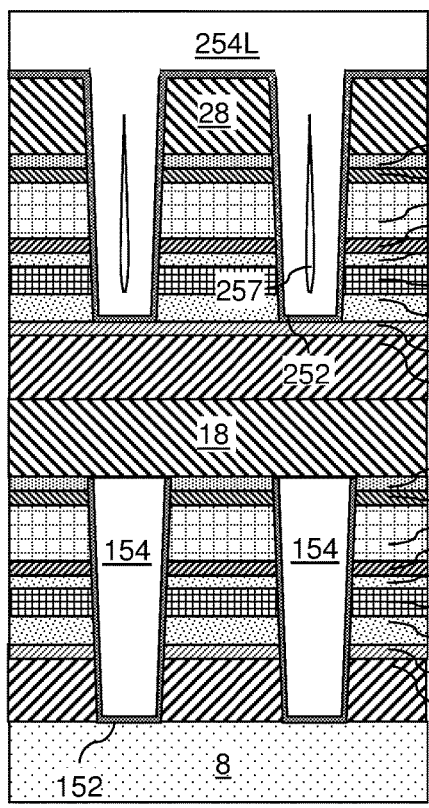
FIG. 17B is a vertical cross-sectional view of the exemplary structure along the vertical plane B-B' of FIG. 17A.
Figure 17C:
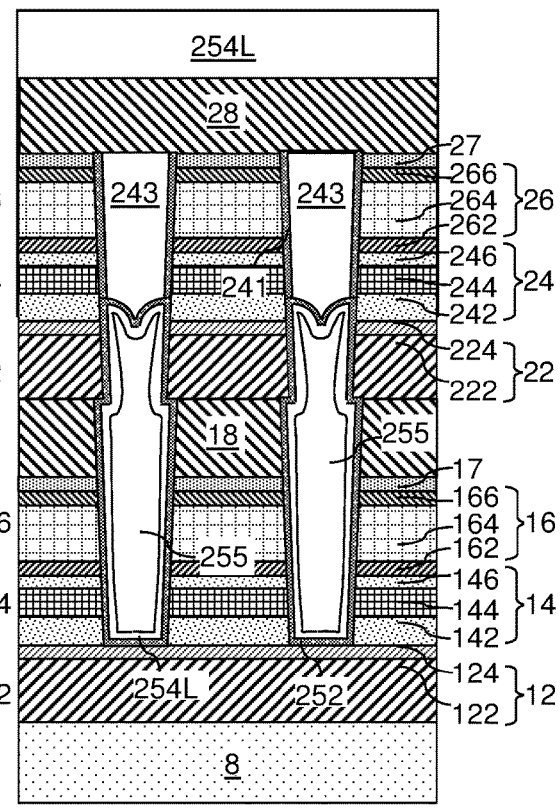
FIG. 17C is a vertical cross-sectional view of the exemplary structure along the vertical plane C-C' of FIG. 17A.
Figure 17D:
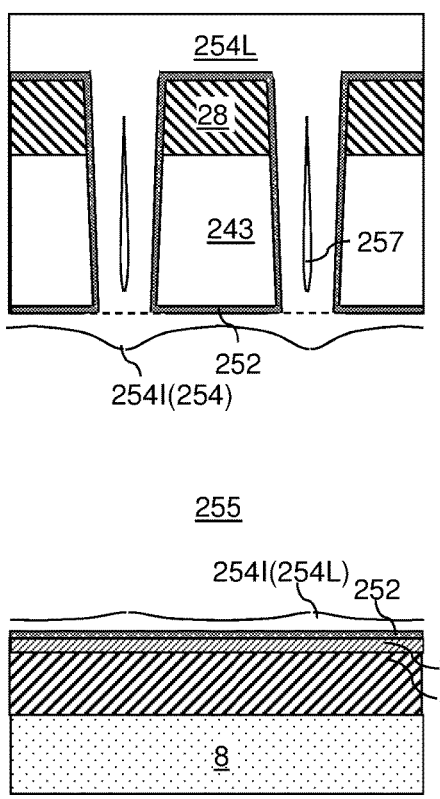
FIG. 17D is a vertical cross-sectional view of the exemplary structure along the vertical plane D-D' of FIG. 17A.
Figure 17E:
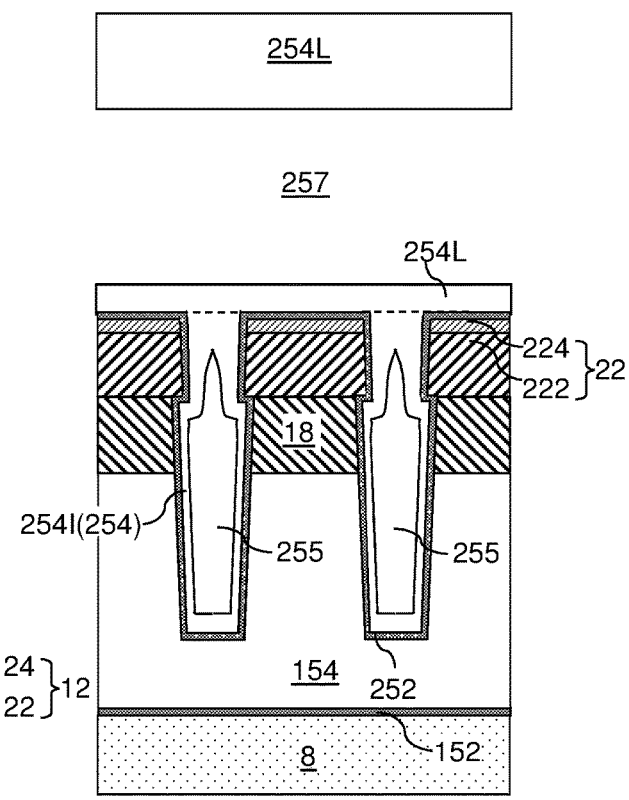
FIG. 17E is a vertical cross-sectional view of the exemplary structure along the vertical plane E-E' of FIG. 17A.
Figure 19A:
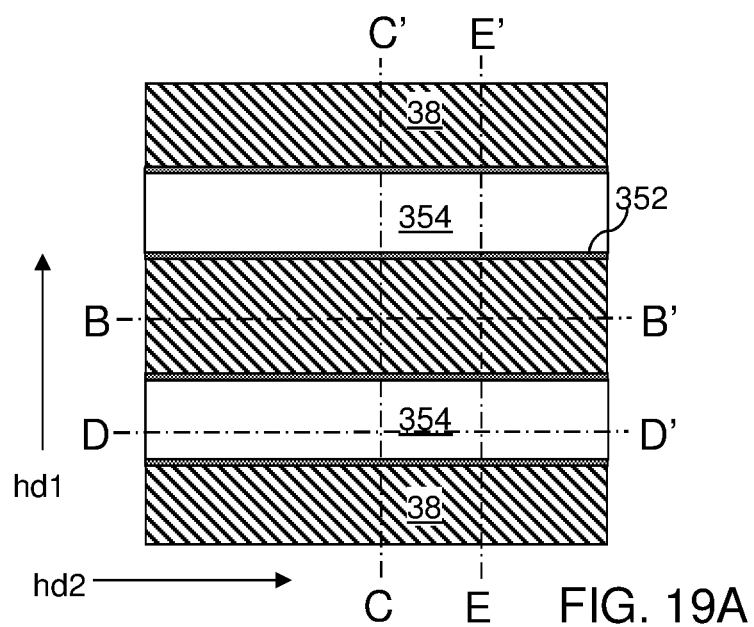
FIG. 19A is a vertical cross-sectional view of the exemplary structure after formation of a rectangular array of third memory pillar structures, additional conductive rails, second cavities, and additional dielectric fill material portions according to an embodiment of the present disclosure.
Figures 19B, 19C:
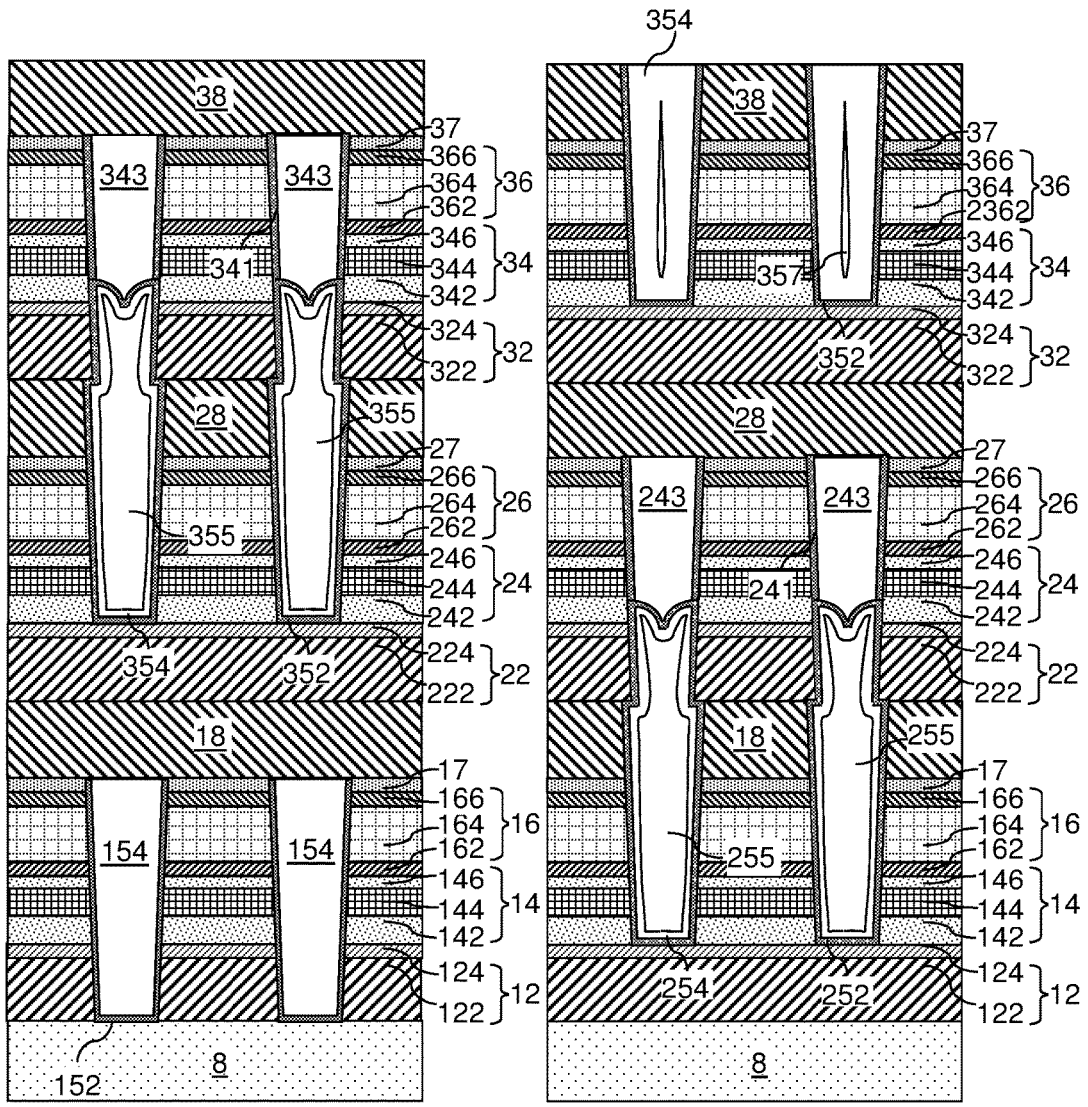
FIG. 19B is a vertical cross-sectional view of the exemplary structure along the vertical plane B-B' of FIG. 19A.
FIG. 19C is a vertical cross-sectional view of the exemplary structure along the vertical plane C-C' of FIG. 19A.

The deposited dielectric fill material seals each upper opening of the fourth trench 25. Each first cavity 215 becomes a first encapsulated cavity 255 that extends along the second horizontal direction hd2. Each first encapsulated cavity 255 may be filled with a gas phase material only, or may be under vacuum. The maximum width of each first encapsulated cavity 255 can be in a range from 30% to 99%, such as from 50% to 90%, of the maximum lateral separation distance between a neighboring pair of second conductive rails (18, 22). The bottom surfaces of the portions of the dielectric fill material layer 254L that define the top surfaces of the first encapsulated cavities 255 may have a vertically undulating profile as illustrated in FIG. 17D. Further, the top surfaces of the portions of the portions of the dielectric fill material layer 254L that define the bottom surfaces of the first encapsulated cavities 255 may have a vertically undulating profile as illustrated in FIG. 17D. In some cases, a second encapsulated cavity 257 may be formed in the dielectric fill material layer 254L located in each fourth trench 25 depending on the anisotropy of the deposition process employed to deposit the dielectric fill material.

In the alternative embodiment in which only the top portions of the first sacrificial trench fill structures (155, 157) are removed at the step of FIGS. 9A-9C, the top surface of the remaining first sacrificial trench fill structures (155, 157) is located below the optional barrier plate 17 such that the first encapsulated cavities 255 are located above the remaining first sacrificial trench fill structures (155, 157) (e.g., the first encapsulated cavities 255 having a bottom surface at a level below the second conductive rails (18, 22) but at or above the level of the top surface of the first phase change elements 16). Thus, in various embodiment, each of the first encapsulated cavities 255 vertically extends at least from a horizontal plane including bottom surfaces of the second conductive rails (18, 22) to at least a horizontal plane including top surfaces of the second conductive rails (18, 22).

Referring to FIGS. 18A-18E, portions of the dielectric fill material layer 254L that overlie the top surfaces of the lower third conductive rail portions 28 (or third conductive rails) can be removed by a planarization process (such as chemical mechanical planarization or a recess etch). Remaining portions of the dielectric fill material layer 254L constitute dielectric fill material portions 254. The dielectric fill material portions 254 include the inner dielectric liners 254I contacting inner sidewalls of the outer dielectric liners 252 at the level of the first encapsulated cavities 255. In one embodiment, regions of the dielectric fill material portions 254 that fill the fourth trenches 25 can be interconnected among one another via regions of the dielectric fill material portions 254 that line the first encapsulated cavities 255 underneath the two-dimensional array of dielectric isolation pillar structures (241, 243). In this case, a single continuous dielectric material structure can include each region of the dielectric fill material portions 254 via interweaving connections among the various regions of the dielectric fill material portions 254 located in the fourth cavities 25 and around the first encapsulated cavities 255.

Generally, the dielectric fill material portions 254 can be formed by anisotropically depositing a dielectric material in the fourth trenches 25 and outer regions of volumes of the one-dimensional array of first cavities 215. The first cavities 215 shrink in volume by deposited dielectric material by less than 50% of the volumes of the one-dimensional array of first cavities 215 as formed by removal of the sacrificial semiconductor structures 212 from underneath the fourth trenches 25 at the processing steps of FIGS. 15A-15E.

The set of processing steps of FIGS. 7A-7C, 8A-8C, 9A-9C, 11A-11C, 12A-12C, 13A-13E, 14A-14E, 15A-15E, 16A-16E, 17A-17E, and 18A-18E can be repeated mutatis mutandis as many times as needed to form additional levels of a rectangular array of pillar structures and additional level of conductive rails. The adjustments in subsequent sets of processing steps can include rotation of patterns by 90 degrees at each level so that a cross-bar array of conductive rails can be provided. Volumes temporarily filled with dielectric fill material portions during formation of an underlying level can be converted into regions including a respective encapsulated cavity during a subsequent set of processing steps for formation of an immediately overlying level.

For example, upon a single repetition of the processing steps of FIGS. 7A-7C, 8A-8C, 9A-9C, 11A-11C, 12A-12C, 13A-13E, 14A-14E, 15A-15E, 16A-16E, 17A-17E, and 18A-18E, the exemplary structure illustrated in FIGS. 19A-19E can be obtained. The exemplary structure of FIGS.

19A-19E include upper third conductive rail portions 32. Each combination of a lower third conductive rail portion 28 and an upper third conductive rail portion 32 constitutes a third conductive rail (28, 32).

A two-dimensional array of third pillar structure (34, 36, 37) can be provided. Each third pillar structure (34, 36, 37) can include, from bottom to top, a third selector pillar 34, a third phase change memory pillar 36, and an optional third barrier plate 37.

In one embodiment, each third selector pillar 34 includes a third ovonic threshold switch material portion 344, an upper amorphous carbon portion that contacts a top surface of the third ovonic threshold switch material portion 344 as a third upper barrier material portion 346, and a lower amorphous carbon portion that contacts a bottom surface of the third ovonic threshold switch material portion 344 as a third lower barrier material portion 342.

Each third selector pillar 34 is a selector element. In one embodiment, each third selector pillar 34 can include a vertical stack of a third lower barrier material portion 342, a third ovonic threshold switch material portion 344, and a third upper barrier material portion 346.

Each third phase change memory pillar 36 is a phase change memory element. In one embodiment, each third phase change memory pillar 36 can include a vertical stack of an optional third lower conductive liner plate 362, a third phase change memory material pillar 364, and a third optional upper conductive liner plate 366.

A two-dimensional array of dielectric isolation pillar structure (341, 343) can be provided. Each dielectric isolation pillar structure (341, 343) can include a pair of dielectric liner segments 341 and a dielectric pillar 343.

Additional dielectric fill material portions 354 fill additional trenches. Second cavities 355 can laterally extend along the first horizontal direction. Outer dielectric liners 352 can line the second cavities 355. The additional dielectric material portions 354 can include inner dielectric liners 3541 that line the second cavities 355. Lower fourth conductive rail portions 38 can laterally extend along the second horizontal direction hd2.

As discussed above, additional levels can be formed by repetition of a set of processing steps needed to form one level with suitable changes in the processing conditions. At each level, encapsulated cavities (255, 355) can be formed between each neighboring pair of conductive rails {(18, 22), (28, 32)}.

While a PCM memory device was described as an exemplary memory device above, it should be understood that any other type of memory device, such as a magnetic random access memory (MRAM) or a metal oxide resistive random access memory (ReRAM) may be formed instead with the above described cavities (e.g., air gaps). Thus, in alternative embodiments, the series connection of a phase change memory element (such as a first phase change memory element 16) and a selector element (such as a first selector element 14) and the optional barrier plate 17 may be replaced with any other type of memory element such as a magnetic memory element or a metal oxide (e.g., titanium oxide or nickel oxide) resistive memory element with or without a selector element (e.g., a diode steering element). As such, each rectangular array of memory pillar structures formed at each memory level can include any type of memory pillar structures known in the art. All such variations are expressly contemplated herein.

Referring to all drawings and according to various embodiments of the present disclosure, a memory device is provided, which comprises: first conductive rails 12 laterally extending along a first horizontal direction hd1 over a substrate 8; a rectangular array of first memory pillar structures overlying top surfaces of the first conductive rails 12, wherein each first memory pillar structure comprises a respective memory element; second conductive rails (18, 22) laterally extending along a second horizontal direction hd2 and overlying top surfaces of the rectangular array of first memory pillar structures; and a one-dimensional array of first cavities 255 free of solid material portions and therein laterally extending along the second horizontal direction hd2 and located between neighboring pairs of the second conductive rails (18, 22).

In one embodiment, a phase change memory device is provided, which comprises: first conductive rails 12 laterally extending along a first horizontal direction hd1 over a substrate 8; a rectangular array of first memory pillar structures (14, 16, 17) overlying top surfaces of the first conductive rails 12, wherein each first memory pillar structure (14, 16, 17) comprises a series connection of a respective first selector element 14 and a respective first phase change memory element 16; second conductive rails (18, 22) laterally extending along a second horizontal direction hd2 and overlying top surfaces of the rectangular array of first memory pillar structures (14, 16, 17); and a one-dimensional array of first cavities 255 free of solid material portions therein (e.g., air gaps) laterally extending along the second horizontal direction hd2.

In one embodiment, the one-dimensional array of first cavities 255 vertically extends at least from a first horizontal plane including interfaces between the first selector elements 14 and first phase change memory elements 16 to a second horizontal plane including bottom surfaces of the second conductive rails (18, 32).

In one embodiment, each of the second conductive rails (18, 22) comprises a vertical stack of a lower second conductive rail portion 18 and an upper second conductive rail portion 22, and each of the first cavities 255 vertically extends above a third horizontal plane including interfaces of the lower second conductive rail portions 18 and the upper second conductive rail portions 22.

In one embodiment, each of the first cavities 255 includes a respective portion that protrudes above a fourth horizontal plane including topmost surfaces of the second conductive rails (18, 22). In one embodiment, each of the upper second conductive rail portions 22 has tapered sidewalls and a lesser width at a respective bottom surface than at a respective top surface along the first horizontal direction hd1, and each of the first cavities 255 has a lesser width at a level of lower portions of the upper second conductive rail portions 22 than at a level of upper portions of the lower second conductive rail portions 18.

In one embodiment, each of the first cavities 255 has a vertical cross-sectional shape within a vertical plane that is perpendicular to the first horizontal direction hd1, and a top portion of the vertical cross-sectional shape includes two vertically protruding regions (corresponding to a pair of convex surfaces of an overlying dielectric isolation pillar structure (242, 243)) laterally spaced by a vertically recessed region.

In one embodiment, the vertical cross-sectional shape is entirely enclosed by an inner surface of at least one dielectric liner (which includes an outer dielectric liner 252 and an inner dielectric liner 254I, if present, having the same material as the dielectric fill material portions 254 as provided at the processing steps of FIGS. 18A-18E)) located between a respective neighboring pair of second conductive rails (18, 22) and between a respective pair of neighboring rows of the first memory pillar structures (14, 16, 17) that are spaced apart along the first horizontal direction hd1.

In one embodiment, the at least one dielectric liner comprises an outer dielectric liner 252 laterally contacting the respective neighboring pair of second conductive rails (18, 22) and between the respective pair of neighboring rows of the first memory pillar structures (14, 16, 17), and an inner dielectric liner 254I defining a boundary of a respective first cavity 255 and located between the respective first cavity 255 and the outer dielectric liner 252.

In one embodiment, the phase change memory device can further comprise: a rectangular array of second memory pillar structures (24, 26, 27) overlying top surfaces of the second conductive rails (18, 22), wherein each second memory pillar structure (24, 26, 27) comprises a series connection of a respective second selector element 24 and a respective second phase change memory element 26; and a rectangular array of dielectric isolation pillars (241, 243) located between each neighboring pair of second memory pillar structures (24, 26, 27) spaced along the first horizontal direction hd1, wherein each first cavity 255 underlies a respective one of the dielectric isolation pillars (241, 243).

In one embodiment, each of the dielectric isolation pillars (241, 243) includes a pair of concave bottom surfaces that laterally extend along the second horizontal direction hd2 and a downward-protruding portion located between the pair of concave bottom surfaces. In one embodiment, each pair of concave bottom surfaces of the dielectric isolation pillars (241, 243) contacts a respective one of the at least one dielectric liners (252, 254).

The various encapsulated cavities (255, 355) of the embodiments of the present disclosure can be employed to reduce capacitive coupling between neighboring pair of conductive rails {(18, 22), (28, 32)}, which can be employed as word lines and bit lines for the rectangular arrays of memory pillar structures {(14, 16, 17), (24, 26, 27)} including respective phase change memory elements (16, 26). In other words, the various encapsulated cavities (255, 355) of the present disclosure provide air gap structures that reduce capacitive coupling among conductive line structures. By reducing the capacitive coupling among the word lines and/or among the bit lines, the RC delay in the word lines and/or the bit lines can be reduced in the three-dimensional phase change memory array of the present disclosure, thereby providing enhanced device performance. The sacrificial semiconductor structures 212 provide a desired controlled height for the encapsulated cavities (e.g., air gaps) without requiring a difficult deposition of an insulating layer in only the upper part of the respective trenches, which may form air gaps with greater than or less then a desirable height.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
    first conductive rails laterally extending along a first horizontal direction over a substrate;
    a rectangular array of first memory pillar structures overlying top surfaces of the first conductive rails, wherein each first memory pillar structure comprises a respective memory element;
    second conductive rails laterally extending along a second horizontal direction and overlying top surfaces of the rectangular array of first memory pillar structures; and
    a one-dimensional array of first cavities free of solid material portions therein laterally extending along the second horizontal direction and located between neighboring pairs of the second conductive rails;
    wherein each first memory pillar structure comprises a series connection of a respective first selector element and a respective first memory element; and
    wherein each first selector element comprises:
        an ovonic threshold switch material portion;
        an upper amorphous carbon portion that contacts a top surface of the ovonic threshold switch material portion; and
        a lower amorphous carbon portion that contacts a bottom surface of the ovonic threshold switch material portion.

2. The memory device of claim 1, wherein each of the first cavities vertically extends from a horizontal plane including bottom surfaces of the second conductive rails to a horizontal plane including top surfaces of the second conductive rails.

3. The memory device of claim 1, wherein:
    each of the second conductive rails comprises a vertical stack of a lower second conductive rail portion and an upper second conductive rail portion; and
    each of the first cavities vertically extends at least from a horizontal plane including interfaces between the first selector elements and first memory elements to a horizontal plane including interfaces of the lower second conductive rail portions and the upper second conductive rail portions.

4. The memory device of claim 1, wherein each of the first cavities includes a respective portion that protrudes above a horizontal plane including topmost surfaces of the second conductive rails.

5. The memory device of claim 1, wherein:
    each of the upper second conductive rail portions has tapered sidewalls and a greater width at a respective bottom surface than at a respective top surface along the first horizontal direction; and
    each of the first cavities has a lesser width at a level of lower portions of the upper second conductive rail portions than at a level of upper portions of the lower second conductive rail portions.

6. The memory device of claim 1, wherein:
    each of the first cavities has a vertical cross-sectional shape within a vertical plane that is perpendicular to the first horizontal direction; and
    a top portion of the vertical cross-sectional shape includes two vertically protruding regions laterally spaced by a vertically recessed region.

7. The memory device of claim 6, wherein the vertical cross-sectional shape is entirely enclosed by an inner surface of at least one dielectric liner located between a respective neighboring pair of second conductive rails and between a respective pair of neighboring rows of the first memory pillar structures that are spaced apart along the first horizontal direction.

8. The memory device of claim 7, wherein the at least one dielectric liner comprises:
an outer dielectric liner laterally contacting the respective neighboring pair of second conductive rails and between the respective pair of neighboring rows of the first memory pillar structures; and
an inner dielectric liner defining a boundary of a respective first cavity and located between the respective first cavity and the outer dielectric liner.

9. The memory device of claim 7, further comprising:
a rectangular array of second memory pillar structures overlying top surfaces of the second conductive rails, wherein each second memory pillar structure comprises a series connection of a respective second selector element and a respective second memory element; and
a rectangular array of dielectric isolation pillars located between each neighboring pair of second memory pillar structures spaced along the first horizontal direction,
wherein each first cavity underlies a respective one of the dielectric isolation pillars.

10. The memory device of claim 9, wherein:
each of the dielectric isolation pillars includes a pair of concave bottom surfaces that laterally extend along the second horizontal direction and a downward-protruding portion located between the pair of concave bottom surfaces; and
each pair of concave bottom surfaces of the dielectric isolation pillars contacts a respective one of the at least one dielectric liners.

11. The memory device of claim 1, wherein each first memory element comprises a phase change memory element including, from bottom to top:
a first lower conductive liner plate comprising a first metallic material;
a first phase change memory material pillar comprising a first phase change memory material; and
a first upper conductive liner plate comprising a second metallic material.

12. The memory device of claim 11, wherein the first phase change memory material is selected from germanium antimony telluride compounds, indium germanium telluride compounds, aluminum selenium telluride compounds, indium selenium telluride compounds, and aluminum indium selenium telluride compounds.

13. The memory device of claim 12, further comprising a two-dimensional array of barrier elements disposed between the first phase change memory elements and a proximal set among a set of the first conductive rails and a set of the second conductive rails.

14. A memory device, comprising:
first conductive rails laterally extending along a first horizontal direction over a substrate;
a rectangular array of first memory pillar structures overlying top surfaces of the first conductive rails, wherein each first memory pillar structure comprises a respective memory element;
second conductive rails laterally extending along a second horizontal direction and overlying top surfaces of the rectangular array of first memory pillar structures;
a one-dimensional array of first cavities free of solid material portions therein laterally extending along the second horizontal direction and located between neighboring pairs of the second conductive rails;
a rectangular array of second memory pillar structures overlying top surfaces of the second conductive rails, wherein each second memory pillar structure comprises a series connection of a respective second selector element and a respective second memory element; and
a rectangular array of dielectric isolation pillars located between each neighboring pair of second memory pillar structures spaced along the first horizontal direction,
wherein:
each first memory pillar structure comprises a series connection of a respective first selector element and a respective first memory element;
each of the first cavities has a vertical cross-sectional shape within a vertical plane that is perpendicular to the first horizontal direction;
a top portion of the vertical cross-sectional shape includes two vertically protruding regions laterally spaced by a vertically recessed region;
the vertical cross-sectional shape is entirely enclosed by an inner surface of at least one dielectric liner located between a respective neighboring pair of second conductive rails and between a respective pair of neighboring rows of the first memory pillar structures that are spaced apart along the first horizontal direction;
each first cavity underlies a respective one of the dielectric isolation pillars;
each of the dielectric isolation pillars includes a pair of concave bottom surfaces that laterally extend along the second horizontal direction and a downward-protruding portion located between the pair of concave bottom surfaces; and
each pair of concave bottom surfaces of the dielectric isolation pillars contacts a respective one of the at least one dielectric liners.

* * * * *